US012772614B2

(12) United States Patent
Kim et al.

(10) Patent No.: US 12,772,614 B2
(45) Date of Patent: Oct. 20, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Su Jeong Kim, Yongin-si (KR); Sang Jo Kim, Yongin-si (KR); Jin Wan Kim, Yongin-si (KR); Hoo Keun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 445 days.

(21) Appl. No.: 18/344,504

(22) Filed: Jun. 29, 2023

(65) Prior Publication Data

US 2024/0063337 A1 Feb. 22, 2024

(30) Foreign Application Priority Data

Aug. 17, 2022 (KR) ........................ 10-2022-0102439

(51) Int. Cl.

| | |
|---|---|
| ***H10H 20/818*** | (2025.01) |
| ***H10H 20/812*** | (2025.01) |
| ***H10H 20/813*** | (2025.01) |
| ***H10H 20/814*** | (2025.01) |
| ***H10H 20/816*** | (2025.01) |
| ***H10H 20/857*** | (2025.01) |

(52) U.S. Cl.

CPC ........ *H10H 20/818* (2025.01); *H10H 20/812* (2025.01); *H10H 20/813* (2025.01); *H10H 20/814* (2025.01); *H10H 20/8162* (2025.01); *H10H 20/857* (2025.01)

(58) Field of Classification Search

None

See application file for complete search history.

(56) References Cited

U.S. PATENT DOCUMENTS

| | | | | |
|---|---|---|---|---|
| 12,159,895 | B2 | 12/2024 | Yeon et al. | |
| 2014/0363912 | A1* | 12/2014 | Ohlsson | H10H 20/01 438/34 |
| 2016/0268547 | A1* | 9/2016 | Kim | H10K 59/873 |
| 2022/0085238 | A1* | 3/2022 | Chudzik | H10H 20/013 |

FOREIGN PATENT DOCUMENTS

| | | | |
|---|---|---|---|
| KR | 10-2017-0084139 | A | 7/2017 |
| KR | 10-2018-0118488 | A | 10/2018 |
| KR | 10-2022-0049065 | A | 4/2022 |
| KR | 10-2022-0058713 | A | 5/2022 |

* cited by examiner

*Primary Examiner* — Bilkis Jahan

(74) *Attorney, Agent, or Firm* — Womble Bond Dickinson (US) LLP

(57) ABSTRACT

A display device includes a substrate including a pixel circuit unit, a partition wall including a distributed Bragg reflector (DBR) structure partitioning a light-emitting area and a non-light-emitting area, and light-emitting elements above the substrate, corresponding to the light-emitting area, and including a first semiconductor layer, an active layer, and a porous semiconductor layer.

18 Claims, 40 Drawing Sheets

DISPLAY DEVICE AND METHOD OF MANUFACTURING THE DISPLAY DEVICE

CROSS-REFERENCE TO RELATED APPLICATION

This application claims priority to, and the benefit of, Korean Patent Application No. 10-2022-0102439 filed on Aug. 17, 2022, in the Korean Intellectual Property Office, the contents of which in its entirety are herein incorporated by reference.

BACKGROUND

1. Field

The present disclosure relates to a display device, and to a method of manufacturing the display device.

2. Description of the Related Art

As the information society develops, the demand for a display device for displaying an image is increasing in various forms. The display device may be a flat panel display, such as a liquid crystal display, a field emission display, or a light-emitting display panel. The light-emitting display device may include an organic light-emitting diode device including an organic light-emitting diode element as a light-emitting element, an inorganic light-emitting device including an inorganic semiconductor element as a light-emitting element, or an ultra-small light-emitting diode element (or a micro light-emitting diode element) as a light-emitting element.

Recently, a head mounted display including a light-emitting display device has been developed. The head mounted display (HMD) is a spectacle-type monitor device of virtual reality (VR) or augmented reality (AR) that the user wears in the form of glasses or a helmet, and the focus is formed at a relatively close distance in front of the eyes.

Aspects of embodiments of the present disclosure provide a display device capable of relieving strain by including a porous semiconductor layer corresponding to a light-emitting element that outputs light of different wavelengths.

In addition, embodiments of the present disclosure improve a reflective efficiency of a partition wall that divides a light-emitting area and a non-light-emitting area by adopting a diffuse Bragg reflector (DBR) structure.

The present disclosure is not limited to the above-mentioned aspects. Other aspects according to the disclosure that are not mentioned may be understood based on following descriptions, and may be more clearly understood based on embodiments according to the disclosure. Further, it will be understood that aspects of the disclosure may be realized using means shown in the claims and combinations thereof.

According to one or more embodiments of the disclosure, the display device includes a substrate including a pixel circuit unit, a partition wall including a distributed Bragg reflector (DBR) structure partitioning a light-emitting area and a non-light-emitting area, and light-emitting elements above the substrate, corresponding to the light-emitting area, and including a first semiconductor layer, an active layer, and a porous semiconductor layer.

The DBR structure may include an undoped GaN layer (PW-U) and a porous GaN layer (PW-NP) that are alternately stacked.

The light-emitting elements may include a first light-emitting element for emitting a first light, a second light-emitting element for emitting a second light, and a third light-emitting element for emitting a third light, wherein the first light, the second light, and the third light have different respective wavelengths.

The partition wall may define a first opening unit, a second opening unit, and a third opening unit having different respective diameters, and overlapping the first emitting area, the second emitting area, and the third emitting area, respectively.

The first light-emitting element, the second light-emitting element, and the third light-emitting element may respectively correspond to the first light-emitting area, the second light-emitting area, and the third light-emitting area, wherein the porous semiconductor layer has a different porosity according to a respective wavelength of the light-emitting elements.

The first opening unit may be wider than the second opening unit, wherein a porosity of the porous semiconductor layer of the first light-emitting element is greater than that of the porous semiconductor layer of the second light-emitting element.

A wavelength of the first light may be longer than that of the second light, wherein a porosity of the porous semiconductor layer of the first light-emitting element is greater than that of the porous semiconductor layer of the second light-emitting element.

An indium content of the active layer of the first light-emitting element may be higher than that of the active layer of the second light-emitting element, wherein a porosity of the porous semiconductor layer of the first light-emitting element is greater than that of the porous semiconductor layer of the second light-emitting element.

The first light may include a red light, the second light may include a green light, and the third light may include a blue light.

The display device may further include a common electrode above the porous semiconductor layer, wherein the first semiconductor layer, the active layer, and the porous semiconductor layer are sequentially stacked in a direction away from the substrate.

The partition wall may include a DBR structure layer including the DBR structure stacked in an extending direction of the light-emitting elements, and an insulating material layer in the non-light-emitting area excluding the DBR structure layer, and including an insulating material.

The substrate may be above the pixel circuit unit, and may further include pixel electrodes respectively connected to the pixel circuit unit.

The display device may further include connection electrodes respectively between, and respectively connecting, the pixel electrodes and the light-emitting elements.

According to one or more embodiments of the disclosure, a display device includes a substrate including a pixel circuit unit, a light-blocking partition wall dividing a light-emitting area and a non-light-emitting area, and a first light-emitting element, a second light-emitting element, and a third light-emitting element above the substrate, and including a first semiconductor layer, an active layer, and a porous semiconductor layer, wherein the first light-emitting element is configured to emit a first light, the second light-emitting element is configured to emit a second light, and the third light-emitting element is configured to emit a third light, and wherein the porous semiconductor layer has different respective porosities in the first light-emitting element, the second light-emitting element, and the third light-emitting element.

The display device may further include a reflective layer between the light-blocking partition wall and the first light-emitting element, and surrounding a side surface of the first light-emitting element, wherein the light-blocking partition wall includes an insulating material.

The reflective layer may include a metal material having reflectivity.

The light-blocking partition wall may define a first opening unit, a second opening unit, and a third opening unit having different respective diameters, and respectively overlapping a first emitting area, a second emitting area, and a third emitting area.

The display device may further include a common electrode above the porous semiconductor layer, wherein the first semiconductor layer, the active layer, and the porous semiconductor layer are sequentially stacked in a direction away from the substrate.

According to one or more embodiments of the disclosure, a method of manufacturing a display device includes forming a partition wall defining a first opening unit, a second opening unit, and a third opening unit on a base substrate, and including a distributed Bragg reflector (DBR), forming a first light-emitting element, a second light-emitting element, and a third light-emitting element sequentially stacked with a third semiconductor layer, a second semiconductor layer, a porous semiconductor layer, an active layer, and a first semiconductor layer, respectively overlapping the first opening unit, the second opening unit, and the third opening unit, and configured to emit light of different respective wavelengths, bonding the partition wall and the light-emitting elements to a substrate including a pixel circuit unit, removing the base substrate, and removing the second semiconductor layer and the third semiconductor layer of the light-emitting elements by etching.

In the forming of the partition wall, an undoped GaN layer and a pre-porous GaN layer may be alternately stacked, and the pre-porous GaN layer may be electrochemically etched to form a porous GaN layer.

The forming of the first light-emitting element, the second light-emitting element, and the third light-emitting element may include adjusting respective porosities of the porous semiconductor layer according to respective wavelengths of the light-emitting elements.

The wavelengths of the light-emitting elements may be proportional to the porosities of the porous semiconductor layer.

The adjusting the porosities of the porous semiconductor layer may include controlling an amount or time of implanted ions.

According to the display device according to one or more embodiments, light of a desired wavelength may be emitted by controlling the porosity of the porous semiconductor layer of the light-emitting element by alleviating the strain of the light-emitting element.

In addition, according to the display device according to one or more embodiments, the light-blocking partition wall may be formed to improve light efficiency.

Aspects of the disclosure are not limited to the above-mentioned aspects, and other aspects as not mentioned will be clearly understood by those skilled in the art from following descriptions.

DETAILED DESCRIPTION

Figure 1:
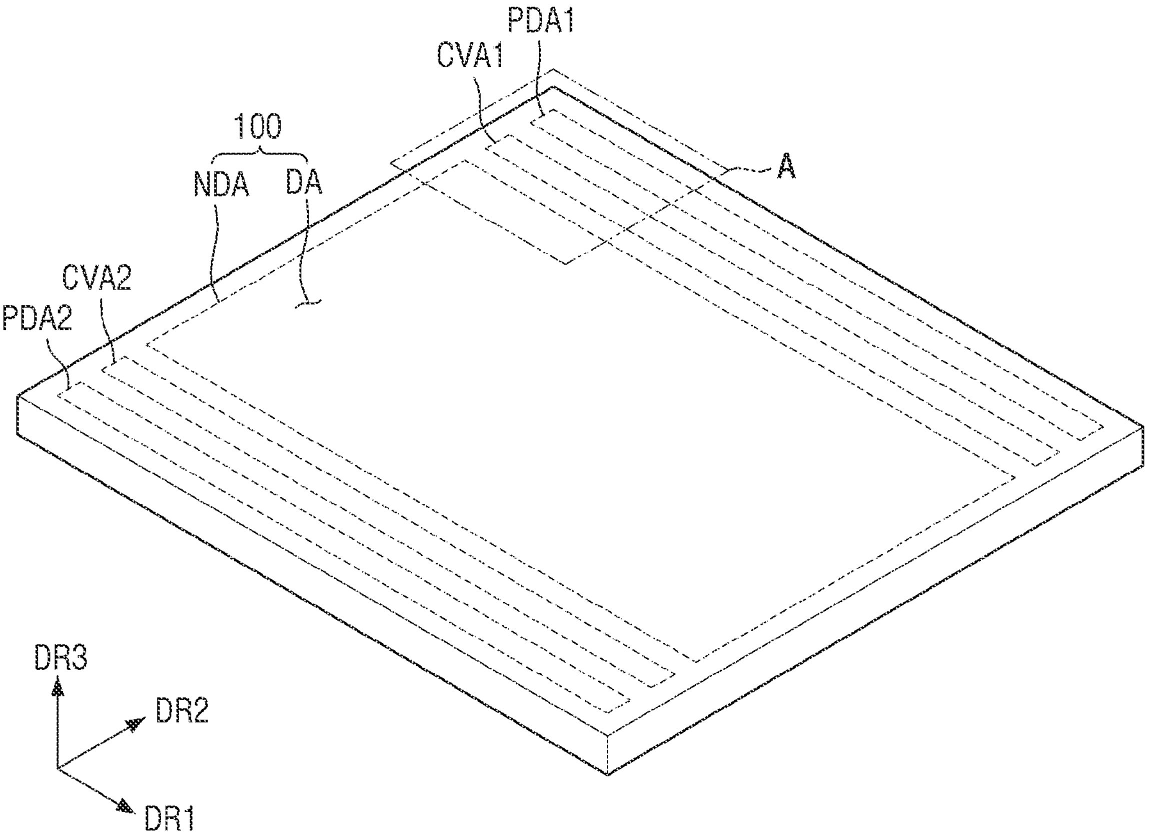
FIG. 1 is a layout diagram illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
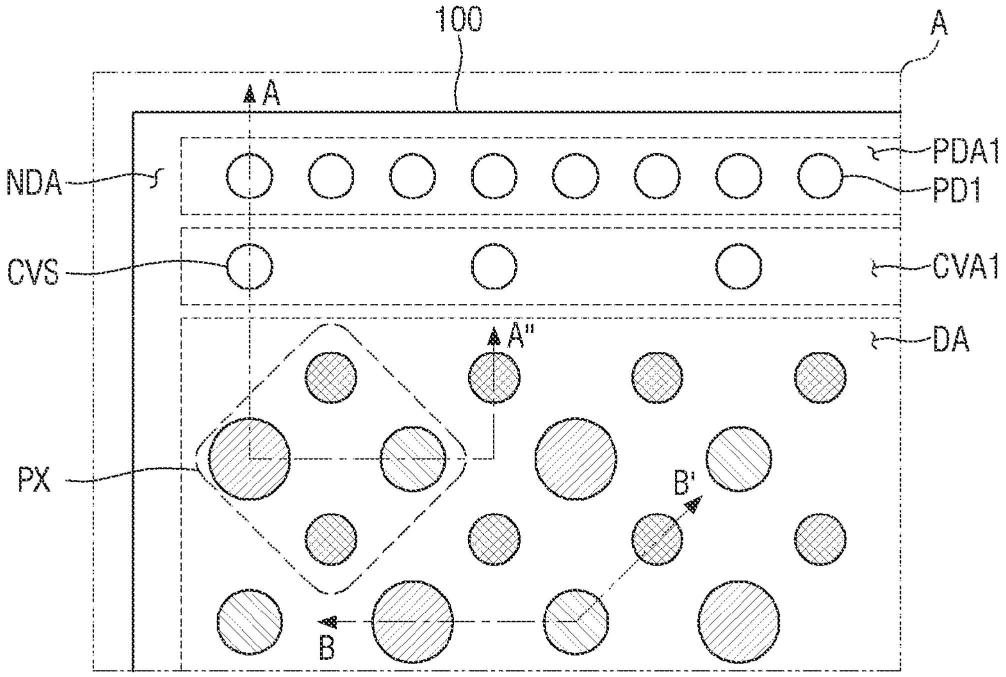
FIG. 2 is a layout diagram illustrating a region A of FIG. 1 in detail.
Figure 3:
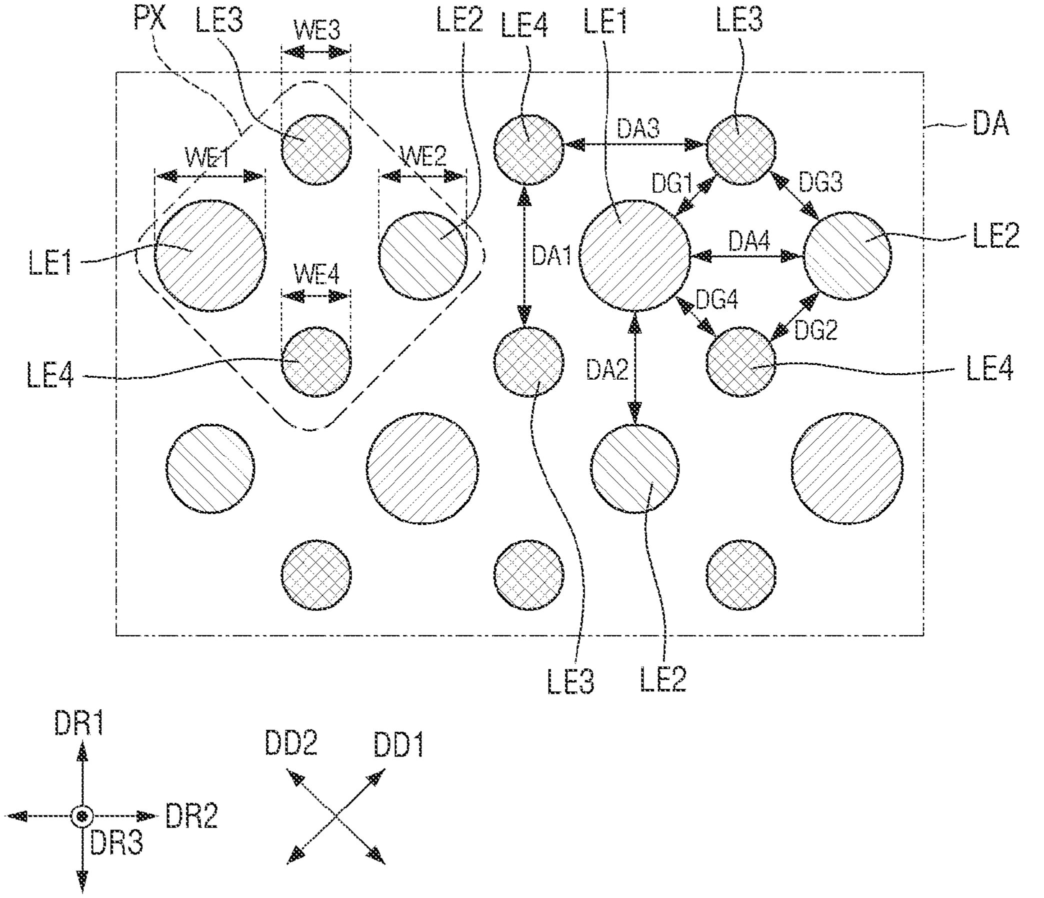
FIG. 3 is a layout diagram illustrating pixels of a display panel according to one or more embodiments.

FIG. 1 is a layout diagram illustrating a display device according to one or more embodiments. FIG. 2 is a layout diagram illustrating a region A of FIG. 1 in detail. FIG. 3 is a layout diagram illustrating pixels of a display panel according to one or more embodiments.

In FIGS. 1 to 3, although it has been mainly described that the display device according to one or more embodiments is a micro light-emitting diode display device (micro or nano light-emitting diode display device) including a micro light-emitting diode (micro or nano light-emitting diode) as a light-emitting element, the present disclosure is not limited thereto.

In addition, in FIGS. 1 to 3, although it has been mainly described that the display device according to one or more embodiments is an LEDoS (light-emitting diode on silicon) in which light-emitting diodes are located as light-emitting elements on a semiconductor circuit board 110 formed by a semiconductor process using a silicon wafer, it should be noted that the embodiments of the present specification are not limited thereto.

Also, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, "left," "right," "top," and "bottom" indicate directions when the display panel 100 is viewed from a plane. For example, "right" refers to one side of the first direction DR1, "left" refers to the other side of the first direction DR1, "upper side" refers to one side of the second direction DR2, and "lower side" refers to the other side in the second direction DR2. Also, "upper" may refer to one side in the third direction DR3 and "lower" may refer to the other side in the third direction DR3.

Referring to FIGS. 1 to 3, a display device 10 according to one or more embodiments includes the display panel 100 including a display area DA and a non-display area NDA.

The display panel 100 may have a rectangular planar shape having a long side in the first direction DR1 and a short side in the second direction DR2. However, the planar shape of the display panel 100 is not limited thereto, and may have a polygonal, circular, oval, or irregular planar shape other than a quadrangle.

The display area DA may be an area in which an image is displayed, and the non-display area NDA may be an area in which an image is not displayed. The planar shape of the display area DA may follow the planar shape of the display panel 100. FIG. 1 illustrates that the display area DA has a rectangular shape. The display area DA may be generally located in a central area of the display panel 100. The non-display area NDA may be located around the display area DA. The non-display area NDA may be located to surround the display area DA (e.g., in plan view).

The display area DA of the display panel 100 may include a plurality of pixels PX. The pixel PX may be defined as a minimum light-emitting unit capable of displaying white light.

Each of the plurality of pixels PX may include the first to fourth light-emitting elements LE1, LE2, LE3, and LE4 for emitting light. In the present disclosure, each of the plurality of pixels PX includes four light-emitting elements LE1, LE2, LE3, and LE4, but the present disclosure is not limited thereto. In addition, although each of the first to fourth light-emitting elements LE1, LE2, LE3, and LE4 is depicted as having a circular planar shape, embodiments of the present specification are not limited thereto.

The first light-emitting element LE1 may emit a first light. The first light may be light of a red wavelength band. For example, the main peak wavelength (B-peak) of the first light may be located at about 600 nm to about 750 nm of the approximately red wavelength band, but embodiments of the present specification are not limited thereto.

The second light-emitting element LE2 may emit a second light. The second light may be light of a green wavelength band. For example, the main peak wavelength (G-peak) of the second light may be located at about 480 nm to about 560 nm, but embodiments of the present specification are not limited thereto.

The third and fourth light-emitting elements LE3 and LE4 may emit a third light. The third light may be light of a blue wavelength band. For example, the main peak wavelength (B-peak) of the first light may be located at about 370 nm to about 460 nm, but embodiments of the present specification are not limited thereto.

In the display device according to one or more embodiments, the size of each of the light-emitting elements LE1, LE2, LE3, and LE4 may be different from each other. In one or more embodiments, a first diameter WE1 of the first light-emitting element LE1 is greater than the diameters WE2, WE3, and WE4 of the second light-emitting element LE2, the third light-emitting element LE3, and the fourth light-emitting element LE4, respectively, and a second diameter WE2 of the second light-emitting element LE2 may be greater than the diameters WE3 and WE4 of the third light-emitting element LE3 and the fourth light-emitting element LE4. The third diameter WE3 of the third light-emitting element LE3 may be the same as the fourth diameter WE4 of the fourth light-emitting element LE4. In one or more other embodiments, the first diameter WE1 of the first light-emitting element LE1 may be the same as the second diameter WE2 of the second light-emitting element LE2.

In one or more embodiments, respective distances between the light-emitting elements LE adjacent to each other may be partially different from each other. For example, a first distance DA1 between the third light-emitting element LE3 and the fourth light-emitting element LE4 adjacent in the first direction DR1 may be greater than a second distance DA2 between the first light-emitting element LE1 and the second light-emitting element LE2 adjacent in the first direction DR1. A third distance DA3 between the third light-emitting element LE3 and the fourth light-emitting element LE4 adjacent in the second direction DR2 may be greater than a fourth distance DA4 between the first light-emitting element LE1 and the second light-emitting element LE2 adjacent in the second direction DR2. In addition, a first diagonal distance DG1 between the first light-emitting element LE1 and the third light-emitting element LE3 adjacent in a first diagonal direction DD1 may be different from a second diagonal distance DG2 between the second light-emitting element LE2 and the fourth light-emitting element LE4 adjacent in the first diagonal direction DD1. A third diagonal distance DG3 between the second light-emitting element LE2 and the third light-emitting element LE3 adjacent in a second diagonal direction DD2 may be different from a fourth diagonal distance DG4 between the first light-emitting element LE1 and the fourth light-emitting element LE4 adjacent in the second diagonal direction DD2.

In one or more embodiments in which the first diameter WE1 of the first light-emitting element LE1 is greater than the second diameter WE2 of the second light-emitting element LE2, the first diagonal distance DG1 may be smaller than the second diagonal distance DG2 and the third diagonal interval DG3 may be greater than the fourth diagonal interval DG4. However, the present disclosure is not limited thereto. The distance between the light-emitting elements LE adjacent to each other may be different depending on the arrangement and diameter of the light-emitting elements LE. For example, in one or more embodiments in which the first diameter WE1 of the first light-emitting element LE1 is the same as the second diameter WE2 of the second light-emitting element LE2, the first diagonal interval DG1 may be equal to the second diagonal interval DG2 and the third diagonal interval DG3 may be equal to the fourth diagonal interval DG4.

In addition, in one or more embodiments, although the illustrated intervals are depicted based on the outer portions of the light-emitting elements LE1, LE2, LE3, and LE4 as an interval DA1 to DA4 and DG1 to DG4 between the light-emitting elements LE1, LE2, LE3, and LE4 but the present disclosure is not limited thereto.

The non-display area NDA may include a first common voltage supply area CVA1, a second common voltage supply area CVA2, a first pad area PDA1, and a second pad area PDA2.

The first common voltage supply area CVA1 may be located between the first pad area PDA1 and the display area DA. The second common voltage supply area CVA2 may be located between the second pad area PDA2 and the display area DA. Each of the first common voltage supply area CVA1 and the second common voltage supply area CVA2 may include a plurality of common voltage supply units CVS connected to a common electrode to be described later.

The common voltage may be supplied to the common electrode through the plurality of common voltage supply units CVS.

The plurality of common voltage supply units CVS of the first common voltage supply area CVA1 may be electrically connected to any one of first pads PD1 of the first pad area PDA1. That is, the plurality of common voltage supply units CVS of the first common voltage supply area CVA1 may receive a common voltage from any one of the first pads of the first pad area PDA1.

The plurality of common voltage supply units CVS of the second common voltage supply area CVA2 may be electrically connected to any one of second pads of the second pad area PDA2. That is, the plurality of common voltage supply units CVS of the second common voltage supply area CVA2 may receive a common voltage from any one of the second pads of the second pad area PDA2.

FIGS. 1 and 2 illustrate that the common voltage supply areas CVA1 and CVA2 are located on respective sides of the display area DA, but the present disclosure is not limited thereto. For example, the common voltage supply areas CVA1 and CVA2 may be located to surround the display area DA (e.g., in plan view).

The first pad area PDA1 may be located above the display panel 100. The first pad area PDA1 may include the first pads PD1 connected to an external circuit board.

The second pad area PDA2 may be located below the display panel 100. The second pad area PDA2 may include second pads connected to an external circuit board. The second pad area PDA2 may be omitted.

Figure 4:
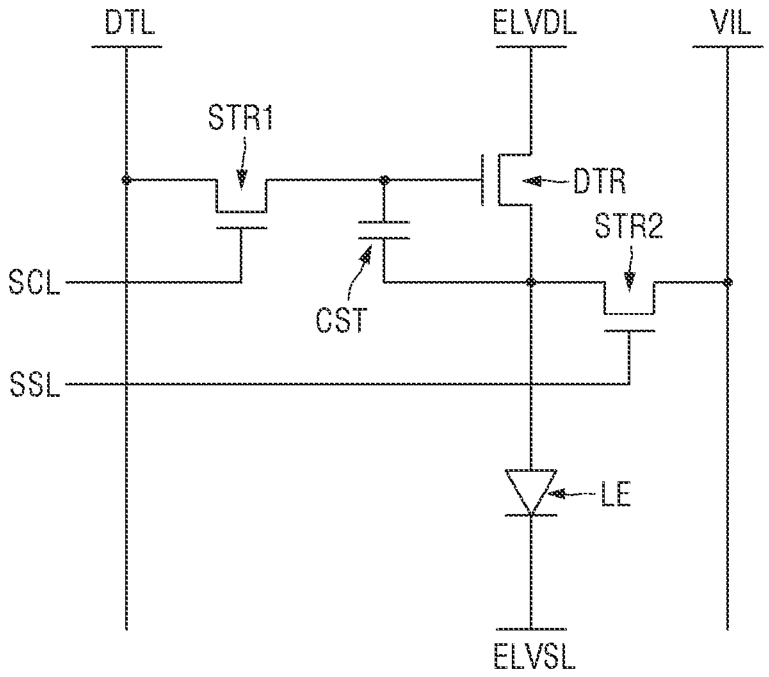
FIG. 4 is an equivalent circuit diagram of one pixel of a display device according to one or more embodiments.
Figure 5:
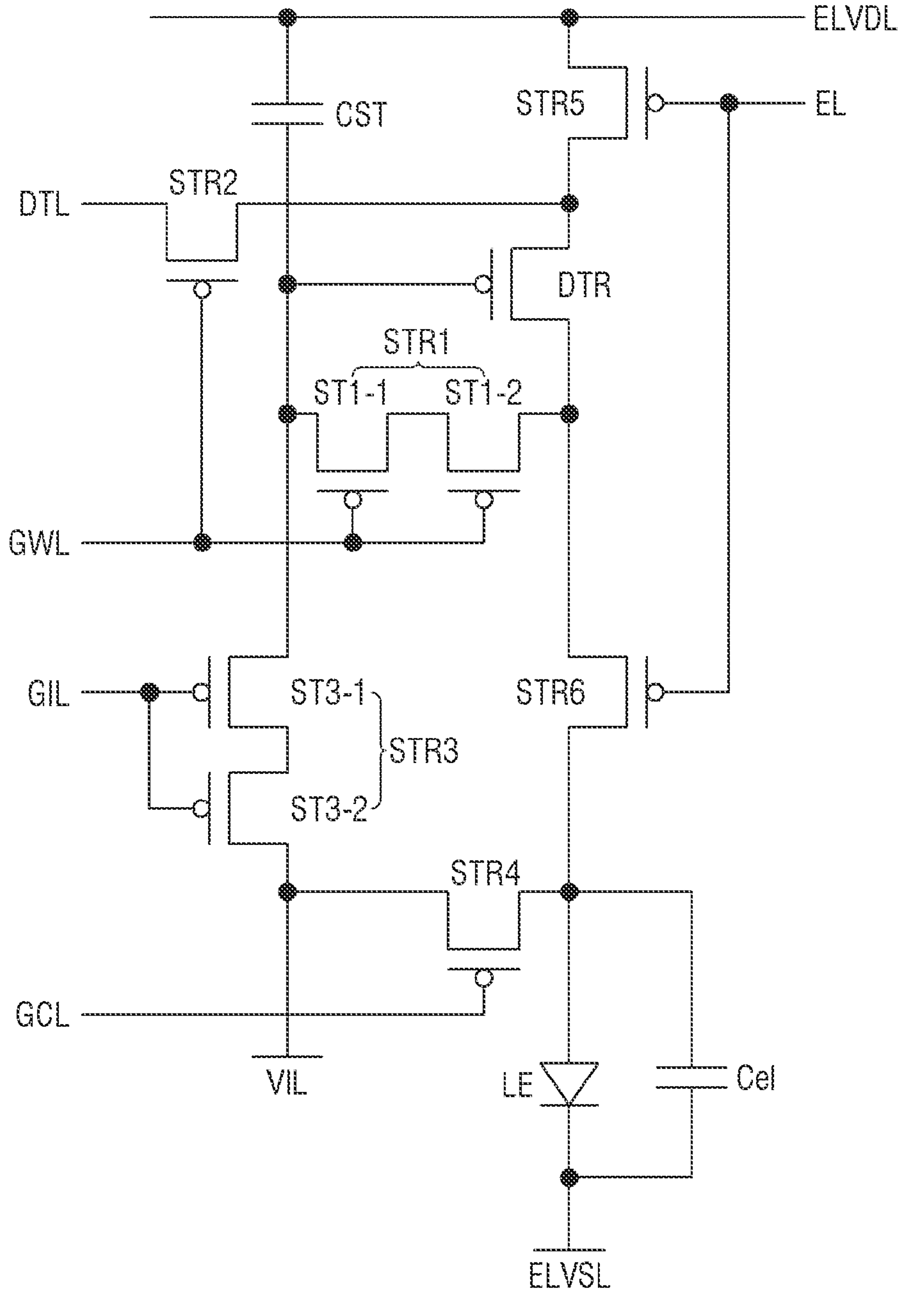
FIG. 5 is an equivalent circuit diagram of one pixel of a display device according to one or more other embodiments.
Figure 6:
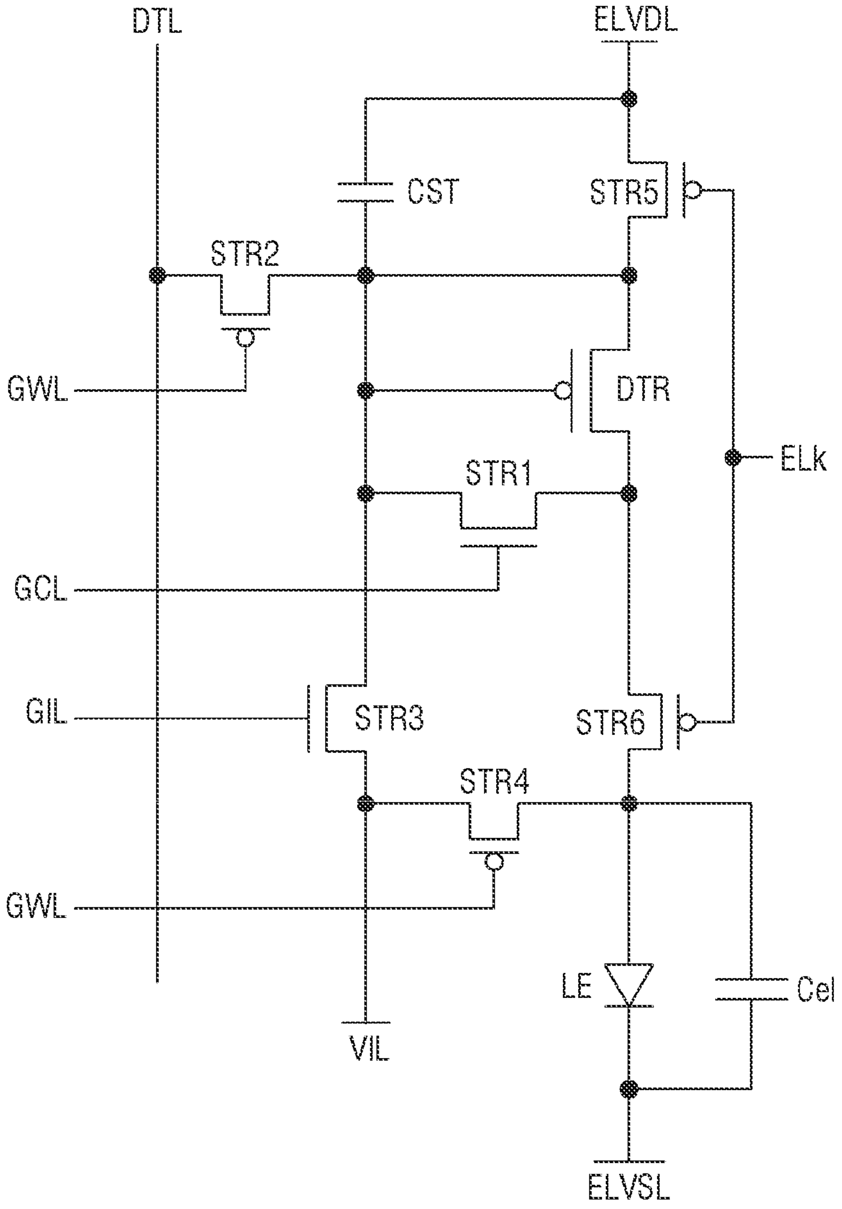
FIG. 6 is an equivalent circuit diagram of one pixel of a display device according to one or more other embodiments.

FIG. 4 is an equivalent circuit diagram of one pixel of a display device according to one or more embodiments. FIG. 5 is an equivalent circuit diagram of one pixel of a display device according to one or more other embodiments. FIG. 6 is an equivalent circuit diagram of one pixel of a display device according to one or more other embodiments.

Referring to FIG. 4, a plurality of pixel circuit units PXC according to one or more embodiments may include three transistors DTR, STR1, and STR2 and one storage capacitor CST.

The light-emitting element LE emits light according to a current supplied through a driving transistor DTR. The light-emitting element LE may be implemented as an inorganic light-emitting diode, an organic light-emitting diode, a micro light-emitting diode, or a nano light-emitting diode.

The first electrode (e.g., an anode electrode) of the light-emitting element LE may be connected to a source electrode of the driving transistor DTR, and the second electrode (e.g., a cathode electrode) of the light-emitting element LE may be connected to a second power supply line ELVSL to which a low potential voltage (second power supply voltage), which is lower than a high potential voltage (first power supply voltage) of the first power supply line ELVDL, is supplied.

The driving transistor DTR adjusts a current flowing from the first power supply line ELVDL, to which the first power supply voltage is supplied, to the light-emitting element LE according to a voltage difference between a gate electrode and a source electrode. The gate electrode of the driving transistor DTR may be connected to the first electrode of the first transistor ST1, the source electrode may be connected to the first electrode of the light-emitting element LE, and the drain electrode may be connected to the first power supply line ELVDL to which the first power supply voltage is applied.

A first transistor STR1 is turned-on by a scan signal of a scan line SCL to connect a data line DTL to the gate electrode of the driving transistor DTR. The gate electrode of the first transistor STR1 may be connected to a scan line SL, the first electrode of the first transistor STR1 may be connected to the gate electrode of the driving transistor DTR, and the second electrode of the first transistor STR1 may be connected to the data line DTL.

The second transistor STR2 is turned-on by a sensing signal of a sensing signal line SSL to connect an initialization voltage line VIL to the source electrode of the driving transistor DTR. The gate electrode of the second transistor ST2 may be connected to the sensing signal line SSL, the first electrode of the second transistor ST2 may be connected to the initialization voltage line VIL, and the second electrode of the second transistor ST2 may be connected to the source electrode of the driving transistor DTR.

In one or more embodiments, the first electrode of each of the first and second transistors STR1 and STR2 may be the source electrode, and the second electrode may be the drain electrode, but the present disclosure is not limited thereto, and vice versa.

The capacitor CST is formed between the gate electrode and the source electrode of the driving transistor DTR. The storage capacitor CST stores a difference voltage between the gate voltage and the source voltage of the driving transistor DTR.

The driving transistor DTR and the first and second transistors STR1 and STR2 may be formed of the thin film transistors. Also, although the driving transistor DTR and the first and second switching transistors STR1 and STR2 have been mainly described in FIG. 4 as N-type metal oxide semiconductor field effect transistors (MOSFET), the present disclosure is not limited thereto. That is, the driving transistor DTR and the first and second switching transistors STR1 and STR2 may be a P-type MOSFET, or some may be a N-type MOSFET, and some may be the P-type MOSFET.

Referring to FIG. 5, the first electrode of the light-emitting element LE of a pixel circuit unit PXC according to one or more other embodiments may be connected to the first electrode of a fourth transistor STR4 and to the second electrode of a sixth transistor STR6, and the second electrode of the light-emitting element LE may be connected to the second power supply line ELVSL. A parasitic capacitance Cel may be formed between the first electrode and the second electrode of the light-emitting element LE.

Each pixel PX includes the driving transistor DTR, switch elements, and the capacitor CST. The switch elements include the first to sixth transistors STR1, STR2, STR3, STR4, STR5, and STR6.

The driving transistor DTR includes the gate electrode, the first electrode, and the second electrode. The driving transistor DTR controls a drain-source current (hereinafter referred to as a "driving current") flowing between the first electrode and the second electrode according to the data voltage applied to the gate electrode.

The capacitor CST is formed between the gate electrode of the driving transistor DTR and the first power supply line ELVDL. One electrode of the capacitor CST may be connected to the gate electrode of the driving transistor DTR and the other electrode may be connected to the first power supply line ELVDL.

When the first electrode of each of the first to sixth transistors STR1, STR2, STR3, STR4, STR5, and STR6 and the driving transistor DTR is the source electrode, the second electrode may be the drain electrode. Alternatively, when the first electrode of each of the first to sixth transistors STR1, STR2, STR3, STR4, STR5, and STR6 and the driving transistor DTR is the drain electrode, the second electrode may be the source electrode.

An active layer of each of the first to sixth transistors STR1, STR2, STR3, STR4, STR5, STR6, and the driving transistor DTR may be formed of any one of polysilicon, amorphous silicon, and/or an oxide semiconductor. When the semiconductor layer of each of the first to sixth transistors STR1, STR2, STR3, STR4, STR5, and STR6, and the driving transistor DTR is formed of polysilicon, a process for forming the semiconductor layer may be low temperature poly silicon (LTPS) process.

In addition, in FIG. 6, although the first to sixth transistors STR1, STR2, STR3, STR4, STR5, and STR6, and the driving transistor DTR were mainly described as being formed of the P-type MOSFET (Metal Oxide Semiconductor Field Effect Transistor), the present disclosure is not limited thereto, and may be formed of the N-type MOSFET.

Furthermore, the first power supply voltage of the first power supply line ELVDL, the second power supply voltage of the second power supply line ELVSL, and a third power supply voltage of the third power supply line VIL may be set in consideration of characteristics of the driving transistor DTR, characteristics of the light-emitting element LE, and the like.

The one or more embodiments corresponding to FIG. 6 is different from the one or more embodiments corresponding to FIG. 5, in that the driving transistor DTR, the second transistor STR2, the fourth transistor STR4, the fifth transistor STR5, and the sixth transistor STR6 are formed of the P-type MOSFET, and the first transistor STR1 and the third transistor STR3 are formed of the N-type MOSFET in the pixel circuit unit PXC according to one or more other embodiments.

Each active layer of the driving transistor DTR, the second transistor STR2, the fourth transistor STR4, the fifth transistor STR5, and the sixth transistor STR6 formed of the P-type MOSFET may be formed of polysilicon, and each active layer of the first transistor STR1 and the third transistor STR3 formed of the N-type MOSFET may be formed of the oxide semiconductor.

The one or more embodiments corresponding to FIG. 6 is a difference from the one or more embodiments corresponding to FIG. 4 in that the gate electrode of the second transistor STR2 and the gate electrode of the fourth transistor STR4 are connected to a write scan line GWL, and the gate electrode of the first transistor ST1 is connected to a control scan line GCL. In addition, in FIG. 6, because the first transistor STR1 and the third transistor STR3 are formed of the N-type MOSFET, a scan signal of a gate high voltage may be applied to the control scan line GCL and an initialization scan line GIL. In contrast, because the second transistor STR2, the fourth transistor STR4, the fifth transistor STR5, and the sixth transistor STR6 are formed of the P-type MOSFET, a scan signal of a gate low voltage may be applied to the write scan line GWL and a light-emitting line EL.

It should be noted that the above-described equivalent circuit diagram of the pixel according to the present disclosure is not limited to that illustrated in FIGS. 4 to 6. The equivalent circuit diagram of the pixel according to the disclosed embodiments may be formed in other known circuit structures employable by those skilled in the art in addition to the embodiments shown in FIGS. 4 to 6.

Figure 7:
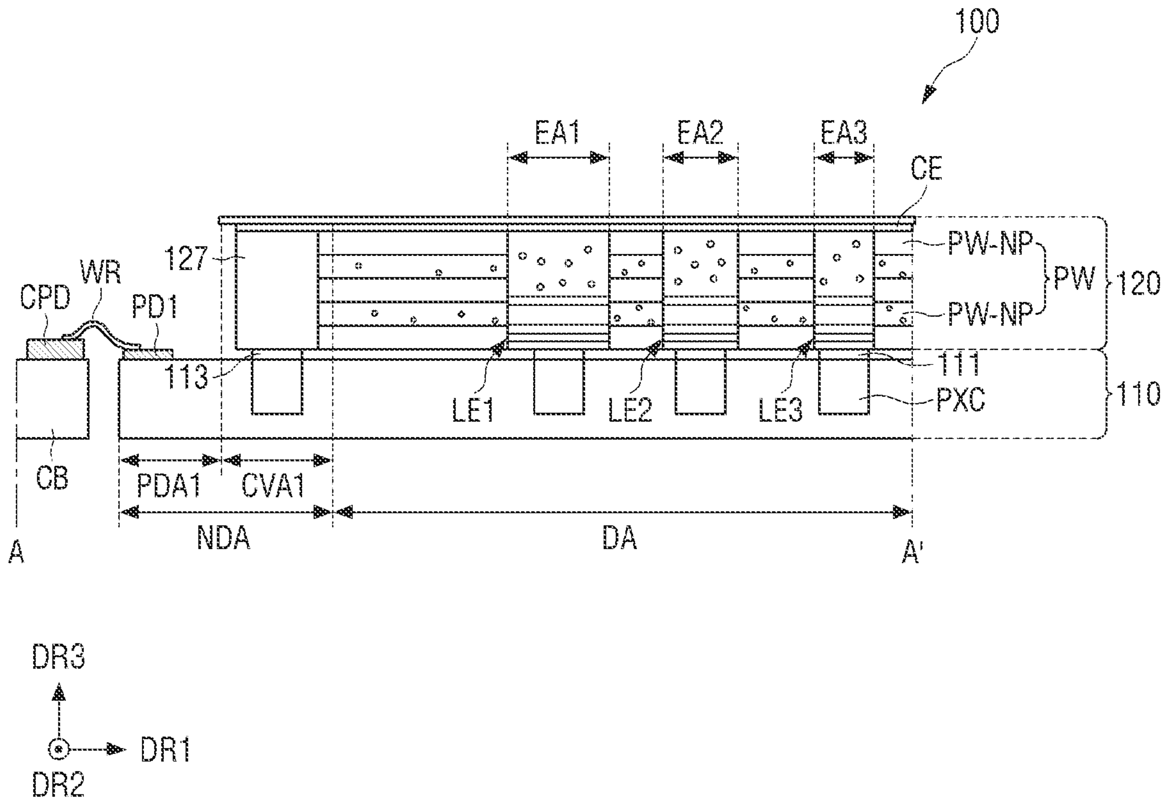
FIG. 7 is a cross-sectional view illustrating one or more embodiments of the display panel taken along the line A-A' of FIG. 2.
Figure 8:
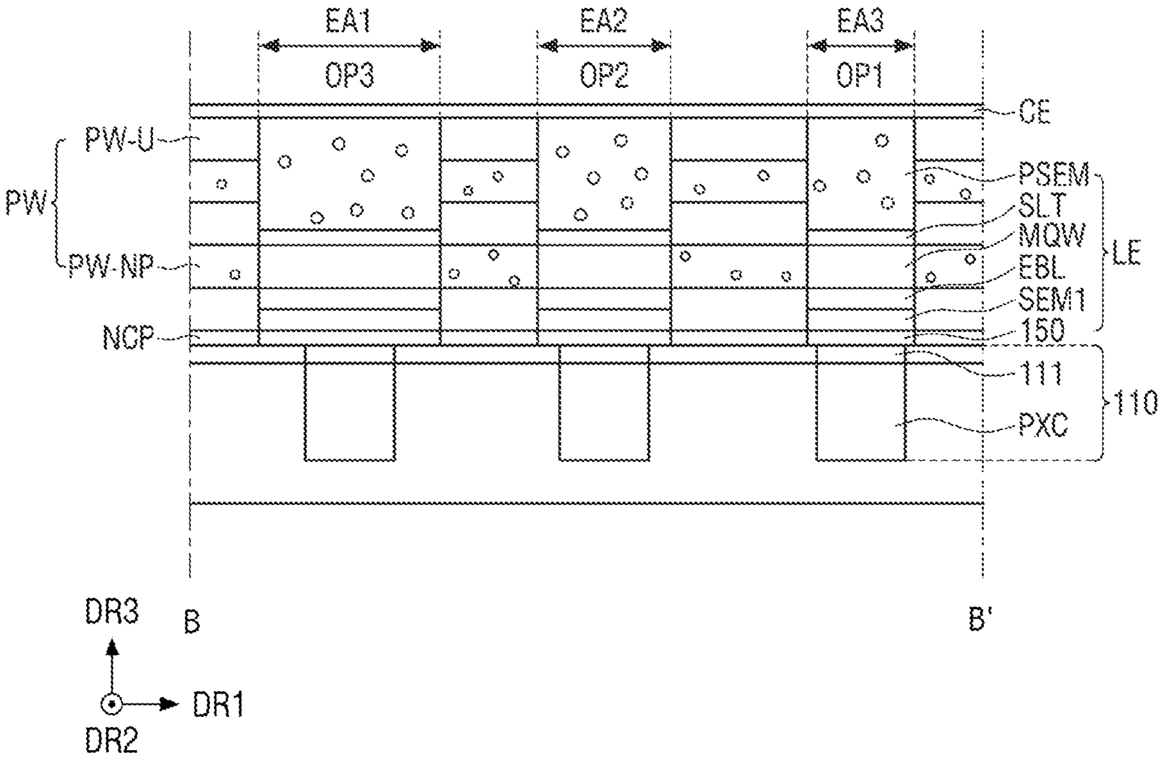
FIG. 8 is a cross-sectional view illustrating one or more embodiments of a display panel taken along the line B-B' of FIG. 2.

FIG. 7 is a cross-sectional view illustrating the display panel taken along the line A-A' of FIG. 2. FIG. 8 is a cross-sectional view illustrating a display panel taken along the line B-B' of FIG. 2.

Referring to FIG. 7, the display panel 100 according to one or more embodiments may include a semiconductor circuit board 110 and a light-emitting element layer 120.

The semiconductor circuit board 110 may include a plurality of pixel circuit units PXC, pixel electrodes 111, first pads PD1, and a common contact electrode 113.

The semiconductor circuit board 110 is a silicon wafer substrate formed using the semiconductor process and may be a first substrate. The plurality of pixel circuit units PXC of the semiconductor circuit board 110 may be formed using the semiconductor process.

The plurality of pixel circuit units PXC may be located in the display area DA and the non-display area NDA. Each of the plurality of pixel circuit units PXC may be connected to the corresponding pixel electrode 111. That is, the plurality of pixel circuit units PXC and a plurality of pixel electrodes 111 may be connected in a one-to-one correspondence. Each of the plurality of pixel circuit units PXC may respectively overlap the light-emitting elements LE1, LE2, and LE3 in the third direction DR3.

Each of the plurality of pixel circuit units PXC may include at least one transistor formed by the semiconductor process. In addition, each of the plurality of pixel circuit units PXC may further include at least one capacitor formed by the semiconductor process. The plurality of pixel circuit units PXC may include, for example, a CMOS circuit. Each of the plurality of pixel circuit units PXC may apply a pixel voltage or an anode voltage to the pixel electrode 111.

Meanwhile, the plurality of pixel electrodes 111 may be located on the corresponding pixel circuit unit PXC. Each of the pixel electrodes 111 may be an exposed electrode exposed from the pixel circuit unit PXC. Each of the pixel electrodes 111 may be integrally formed with the pixel circuit unit PXC. Each of the pixel electrodes 111 may receive the pixel voltage or the anode voltage from the pixel circuit unit PXC. The pixel electrodes 111 may include at least one of gold (Au), copper (Cu), tin (Sn), and/or silver (Ag). For example, the pixel electrode 111 may include a 9:1 alloy, an 8:2 alloy, or a 7:3 alloy of gold and/or tin, or may also include an alloy of copper, silver and/or tin SAC305.

The common contact electrode 113 may be located in the first common voltage supply area CVA1 of the non-display area NDA. The common contact electrode 113 may be located on both sides of the display area DA. The common contact electrode 113 may be connected to any one of the first pads PD1 of the first pad area PDA1 through a circuit unit formed in the non-display area NDA to receive a common voltage. The common contact electrode 113 may include the same material as the pixel electrodes 111. That is, the common contact electrode 113 and the pixel electrodes 111 may be formed by the same process.

Each of the first pads PD1 may be connected to a pad electrode CPD of a circuit board CB through a conductive connection member, such as a wire WR corresponding thereto. That is, the first pads PD1, the wires WR, and the pad electrodes CPD of the circuit board CB may be connected to each other in a one-to-one manner.

The circuit board CB may be a flexible film, such as a flexible printed circuit board (FPCB), a printed circuit board (PCB), a flexible printed circuit (FPC), or a chip on film (COF).

Meanwhile, because the second pads of the second pad area PDA2 may be substantially the same as the above-described first pads PD1, a description thereof will be omitted.

The light-emitting element layer 120 may include the light-emitting elements LE, a connection electrode 150, and a common connection electrode 127.

The light-emitting element layer 120 may include first light-emitting areas EA1, second light-emitting areas EA2, and third light-emitting areas EA3 corresponding to each of the light-emitting elements LE. In each of the first light-emitting areas EA1, the second light-emitting areas EA2, and the third light-emitting areas EA, the light-emitting elements LE may be located in a one-to-one correspondence.

The light-emitting element LE may be located on the pixel electrode 111 in each of the first light-emitting areas EA1, the second light-emitting areas EA2, and the third light-emitting areas EA3. The light-emitting element LE may be a vertical light-emitting diode element extending lengthwise in the third direction DR3. That is, a length of the light-emitting element LE in the third direction DR3 may be longer than a length or width in the horizontal direction. The horizontal length indicates a length in the first direction DR1 or a length in the second direction DR2. For example, the length of the light-emitting element LE in the third direction DR3 may be about 1 μm to about 5 μm.

The light-emitting element LE may be a micro light-emitting diode element. As shown in FIG. 8, the light-emitting element LE may include the connection electrode 150, a first semiconductor layer SEM1, an electron-blocking layer EBL, an active layer MQW, a superlattice layer SLT, and a porous semiconductor layer PSEM. The connection electrode 150, the first semiconductor layer SEM1, the electron-blocking layer EBL, the active layer MQW, the superlattice layer SLT, and the porous semiconductor layer PSEM may be sequentially stacked in the third direction DR3.

The light-emitting element LE may have a cylindrical shape, a disk shape, or a rod shape having a width that is longer than a height. However, the present disclosure is not limited thereto, and the light-emitting element LE may have a shape of a rod, a wire, a tube, etc., a shape of a polygonal prism, such as a cube, a cuboid, or a hexagonal prism, or may have various shapes, such as a shape extending in one direction and having an outer surface partially inclined.

The connection electrode 150 may be located on the pixel electrode 111. The connection electrode 150 may serve to apply a light-emitting signal to the light-emitting element LE by being attached to the pixel electrode 111. The light-emitting element LE may include at least one connection electrode 150. FIG. 8 illustrates that the light-emitting element LE includes one connection electrode 150, but the present disclosure is not limited thereto. In some cases, the light-emitting element LE may include a larger number of connection electrodes 150, or may be omitted. The description of the light-emitting element LE, which will be described later, may be applied in the same manner even if the number of connection electrodes 150 is different or includes other structures.

The connection electrode 150 may reduce resistance between the light-emitting element LE and the contact electrode when the light-emitting element LE is electrically connected to the pixel electrode in the display panel 100 according to one or more embodiments. The connection electrode 150 may include a conductive metal. For example, the connection electrode 150 may include at least one of gold (Au), copper (Cu), tin (Sn), titanium (Ti), aluminum (Al), and/or silver (Ag). For example, the connection electrode 150 may include a 9:1 alloy, an 8:2 alloy, or a 7:3 alloy of gold and/or tin, or an alloy of copper, silver, and/or tin SAC305.

In one or more embodiments, an ohmic contact layer may be further located on the connection electrode 150. The ohmic contact layer may be located between the connection electrode 150 and the first semiconductor layer SEM1. The ohmic contact layer may be an ohmic connection electrode. However, the present disclosure is not limited thereto, and the ohmic contact layer may be a Schottky connection electrode. The ohmic contact layer may include ITO. However, the present disclosure is not limited thereto, and the ohmic contact layer may include at least one selected from gold (Au), copper (Cu), tin (Sn), titanium (Ti), aluminum (Al), and/or silver (Ag), and/or alloys thereof or may be formed of these alloys or their multilayer structure.

Meanwhile, a filler NCP may be located between the semiconductor circuit board 110 and the light-emitting element layer 120. The filler NCP may serve to bond between the semiconductor circuit board 110 and the light-emitting element layer 120. The filler NCP may be located to fill between the semiconductor circuit board 110 and the light-emitting element layer 120. The filler NCP may include an insulating material, for example, an organic insulating material.

The first semiconductor layer SEM1 may be located on the connection electrode 150. The first semiconductor layer SEM1 may be a p-type semiconductor and may include a semiconductor material having a chemical formula of $Al_xGa_yIn_{1-x-y}N$ ($0 \le x \le 1$, $0 \le y \le 1$, $0 \le x+y \le 1$). For example, it may be any one or more of AlGaInN, GaN, AlGaN, InGaN, AlN, and/or InN doped with p-type. The first semiconductor layer SEM1 may be doped with a p-type dopant, and the p-type dopant may be Mg, Zn, Ca, Se, Ba, or the like. For example, the first semiconductor layer SEM1 may be p-GaN doped with p-type Mg. A thickness of the first semiconductor layer SEM1 may range from about 30 nm to about 200 nm but is not limited thereto.

The electron-blocking layer EBL may be located on the first semiconductor layer SEM1. The electron-blocking layer EBL may be a layer for suppressing or preventing too many electrons from flowing into the active layer MQW. For example, the electron-blocking layer EBL may be p-AlGaN doped with p-type Mg. A thickness of the electron-blocking layer EBL may be in a range of about 10 nm to about 50 nm but is not limited thereto. Also, the electron-blocking layer EBL may be omitted.

The active layer MQW may be located on the electron-blocking layer EBL. The active layer MQW may emit light by combining electron-hole pairs according to an electric signal applied through the first semiconductor layer SEM1 and the second semiconductor layer SEM2. The active layer MQW may emit a first light, that is, light of the blue wavelength band, or a second light, that is, light of the green wavelength band.

The active layer MQW may include a material having a single or multiple quantum well structure. When the active layer MQW includes a material having a multi-quantum well structure, a plurality of well layers and barrier layers may be alternately stacked. In this case, the well layer may be formed of InGaN, and the barrier layer may be formed of GaN or AlGaN but is not limited thereto. A thickness of the well layer may be about 1 nm to about 4 nm, and the thickness of the barrier layer may be about 3 nm to about 10 nm.

Alternatively, the active layer MQW may have a structure in which a semiconductor material having a large band gap energy and a semiconductor material having a small band gap energy are alternately stacked with each other and may include other Group 3 to Group 5 semiconductor materials depending on the wavelength band of the emitted light.

The light emitted by the active layer MQW is not limited to the first light, and in some cases, the second light (light of the green wavelength band), or the third light (light of the red wavelength band) may be emitted. In one or more embodiments, when indium is included among the semiconductor materials included in the active layer MQW, the color of emitted light may vary according to the content of indium. For example, light of the blue wavelength band may be emitted when the content of indium is about 15%, light of the green wavelength band may be emitted when the content of indium is about 25%, and light of the red wavelength band may be emitted when the content of indium is about 35% or more.

The superlattice layer SLT may be located on the active layer MQW. The superlattice layer SLT may be a layer for relieving stress between the second semiconductor layer SEM2 and the active layer MQW. For example, the superlattice layer SLT may be formed of InGaN or GaN. A thickness of the superlattice layer SLT may be about 50 nm to about 200 nm. The superlattice layer SLT may be omitted.

The porous semiconductor layer PSEM may be located on the superlattice layer SLT. The porous semiconductor layer PSEM is a porous semiconductor layer doped with silicon (Si) ions. The strain of the light-emitting element may be relieved by the porous semiconductor layer PSEM. The degree of strain relief is different depending on the porosity. Therefore, because the strain received by the light-emitting element is different depending on the size of the light-emitting area, the porosity of the porous semiconductor layer PSEM may be different according to the size of the light-emitting area, thereby controlling the strain.

In one or more embodiments, the porosity of the porous semiconductor layer PSEM corresponding to the first light-emitting area EA1, the second light-emitting area EA2, and the third light-emitting area EA3 may be different from each other. For example, the porosity of the first light-emitting area EA1 may be greater than that of the second light-emitting area EA2. Also, the porosity of the second light-emitting area EA2 may be greater than that of the third light-emitting area EA3.

A light-blocking partition wall PW1 may include a plurality of opening units OP1, OP2, and OP3. The plurality of opening units OP1, OP2, and OP3 may include a third opening unit OP3 overlapping the first emitting area EA1, a second opening unit OP2 overlapping the second emitting area EA2, and a first opening unit OP1 overlapping the third light opening unit area EA3. Here, the plurality of opening units OP1, OP2, and OP3 may correspond to the plurality of light-emitting areas EA1, EA2, and EA3. That is, the first opening unit OP1 may correspond to the first opening unit area EA3, the second opening unit OP2 may correspond to the second opening unit area EA2, and the third opening unit OP3 may correspond to the third opening unit area EA3. A planar shape of the plurality of opening units OP1, OP2, and OP3 may be circular. However, the present disclosure is not limited thereto, and the planar shape of the plurality of opening units OP1, OP2, and OP3 may follow the planar shape of the light-emitting element LE. For example, the planar shape of the plurality of opening units OP1, OP2, and OP3 may be a polygon, such as a triangle, a quadrangle, or a pentagon.

The light-blocking partition wall PW may reflect side light, which is light emitted from the light-emitting element LE and which does not travel upward, but instead exits toward the light-blocking partition wall PW. That is, because the side light of the light-emitting element LE may be guided so that the side light travels upward with little or no loss, light extraction efficiency may be improved, and high light-emitting efficiency may be provided.

In one or more embodiments, the light-blocking partition wall PW may be formed in a distributed Bragg reflectors (DBR) structure. The diffuse Bragg reflector structure is a structure in which two materials having different refractive indices are paired. Fresnel reflection occurs at each interface due to a refractive index difference. For example, the light-blocking partition wall PW may have a DBR structure in which an undoped GaN layer (PW-U) and a porous GaN layer (PW-NP) are alternately and repeatedly stacked.

In FIG. 8, the undoped GaN layer (PW-U) and the porous GaN layer (PW-NP) are repeatedly stacked twice, but the present disclosure is not limited thereto. The undoped GaN layer (PW-U) refers to the undoped GaN layer, and the porous GaN layer (PW-NP) refers to the GaN layer in which nanopores are formed.

One layer of undoped GaN layer (PW-U) and one layer of porous GaN layer (PW-np) are referred to as a pair.

The light-blocking partition wall PW according to one or more embodiments may have two or more pairs of DBR structures. In the case of two or more pairs of DBR structures, it is confirmed that there is a reflection efficiency at a wavelength of about 350 nm to about 650 nm.

A common electrode CE may be located on the light-emitting element LE and the light-blocking partition wall PW. The common electrode CE may be formed entirely on (e.g., formed over an entirety of) the light-emitting element LE and the light-blocking partition wall PW in one or more embodiments. The common electrode CE may be a common layer commonly formed in all the light-emitting element LE. The common electrode CE may be the cathode electrode in one or more embodiments. The common electrode CE, in one or more embodiments, may include any one or more selected from the group consisting of Li, Ca, LiF/Ca, LiF/Al, Al, Ag, and/or Mg. Also, the common electrode CE may be formed of a metal thin film having a low work function. The common electrode CE, in one or more embodiments, may be a transparent or semi-transparent electrode including any one or more selected from the group consisting of ITO (Indium Tin Oxide), IZO (Indium Zinc Oxide), ZnO (Zinc Oxide), In2O3 (Indium, Oxide), (IGO, Indium Gallium Oxide), and/or AZO (Aluminum Zinc Oxide).

The common electrode CE in the upper light-emitting structure may be formed of a transparent conductive oxide (TCO), such as indium tin oxide (ITO) and/or indium zinc oxide (IZO) that may transmit light, or may be formed of a semi-transmissive conductive material, such as magnesium (Mg), silver (Ag), or an alloy of magnesium (Mg) and/or silver (Ag). When the common electrode CE is formed of a transflective metal material, light output efficiency may be increased by a micro cavity.

Meanwhile, the common connection electrode 127 may be located in the first common voltage supply area CVA1 of the non-display area NDA. The common connection electrode 127 may be connected to the common electrode CE. The common connection electrode 127 may serve to transmit a common voltage signal of the light-emitting elements LE from the common contact electrode 113. The common connection electrode 127 may be made of the same material as the connection electrodes 150. The common connection electrode 127 may be relatively thick in the third direction DR3 to be connected to the common contact electrode 113.

The above-described light-emitting elements LE may receive the pixel voltage or the anode voltage of the pixel electrode 111 through the connection electrode 150, and may receive the common voltage through the common electrode CE. The light-emitting element LE may emit light with a luminance (e.g., predetermined luminance) according to the voltage difference between the pixel voltage and the common voltage.

Figure 9:
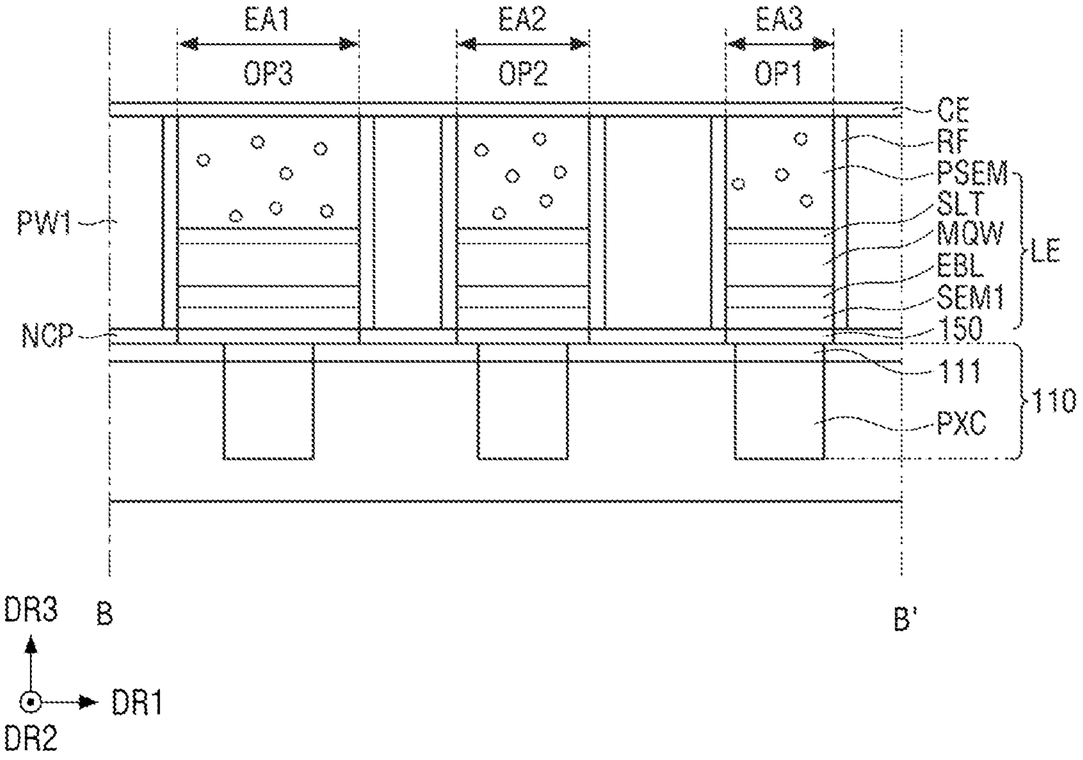
FIG. 9 is a cross-sectional view illustrating one or more embodiments of a display panel taken along the line B-B' of FIG. 2.

FIG. 9 is a cross-sectional view illustrating a display panel taken along the line B-B' of FIG. 2 according to one or more other embodiments.

The one or more embodiments corresponding to FIG. 9 is different from the one or more embodiments corresponding to FIG. 8 in that the light-blocking partition wall PW1 is formed of an insulating material and includes a reflective layer RF. Hereinafter, descriptions of the same components will be simplified or omitted, and differences will be described in detail.

The light-blocking partition wall PW1 is located to be extended in the first direction DR1 and the second direction DR2 and may be formed in a grid-shaped pattern over the entire display area (DA of FIG. 2). In addition, the partition wall PW may not overlap the plurality of light-emitting areas EA1, EA2, and EA3, and may overlap a non-light-emitting area NEA.

The light-blocking partition wall PW1 may serve to provide a space for the light-emitting element LE to be formed. To this end, the light-blocking partition wall PW1 may have a thickness (e.g., predetermined thickness). For example, the light-blocking partition wall PW1 may have a thickness of about 1 μm to about 10 μm. The light-blocking partition wall PW1 may include the organic insulating material to have the thickness (e.g., predetermined thickness). The organic insulating material may include, for example, an epoxy-based resin, an acrylic-based resin, a cardo-based resin, or an imide-based resin.

The light-blocking partition wall PW1 may further include the reflective layer RF. The reflective layer RF may overlap a side surface of the light-emitting element LE. The reflective layer RF serves to reflect the light that travels in the up, down, right, and left lateral directions, as opposed to traveling in the upper direction, among the light emitted from the light-emitting element LE. The reflective layer RF may include a metal material having high reflectivity, such as aluminum (Al). The thickness of the reflective layer RF may be about 0.1 μm.

In another modification, a second insulating layer may be added between the reflective layer RF and the light-emitting element LE.

Figure 10:
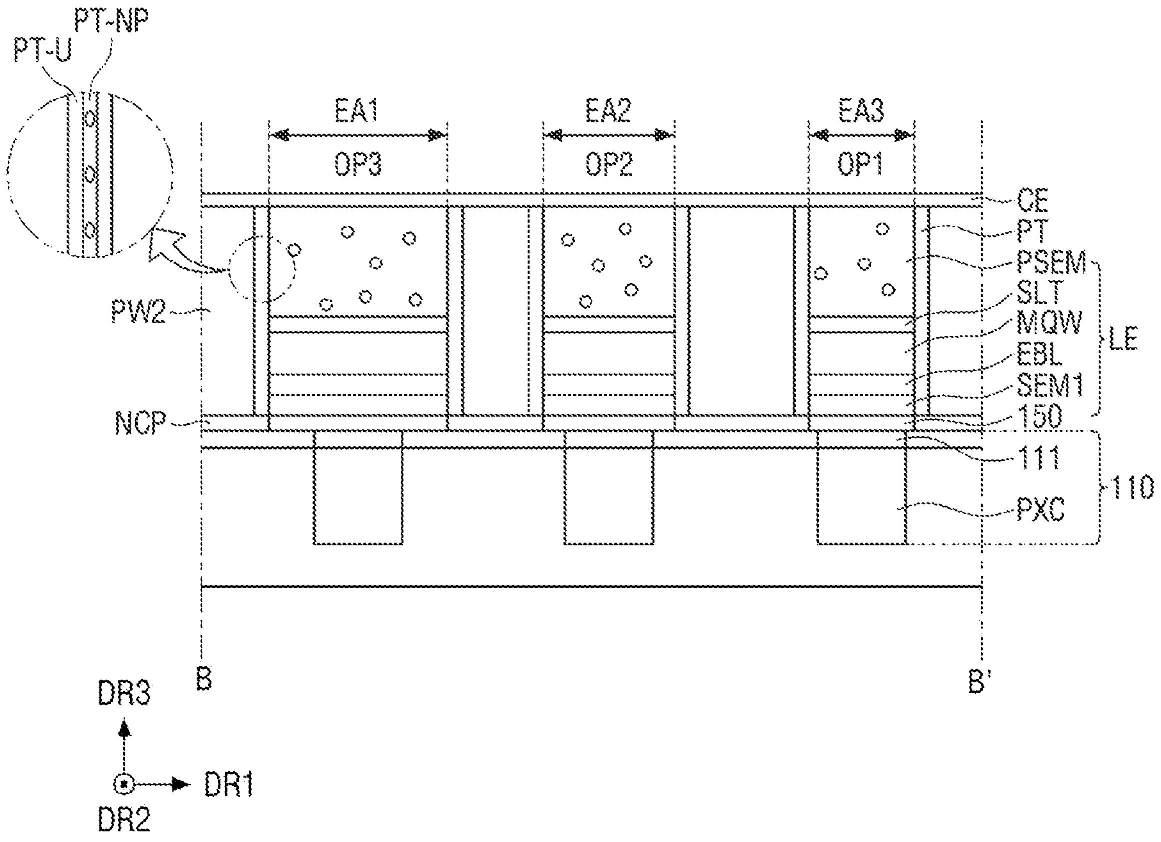
FIG. 10 is a cross-sectional view illustrating one or more embodiments of a display panel taken along the line B-B' of FIG. 2.

FIG. 10 is a cross-sectional view illustrating a display panel taken along the line B-B' of FIG. 2 according to one or more other embodiments.

The one or more embodiments corresponding to FIG. 10 is different from the one or more embodiments corresponding to FIG. 8 in that the light-blocking partition wall PW2 is formed of the insulating material, and adopts a DBR structure stacked in the extending direction of the light-emitting element. Hereinafter, descriptions of the same components will be simplified or omitted, and differences will be described in detail.

The light-blocking partition wall PW2 is located to extend in the first direction DR1 and the second direction DR2, and may be formed in a grid pattern over the entire display area (DA of FIG. 2). In addition, the light-blocking partition wall PW2 may not overlap the plurality of light-emitting areas EA1, EA2, and EA3, and may overlap the non-light-emitting area NEA.

The light-blocking partition wall PW2 may serve to provide a space for the light-emitting element LE to be formed. The light-blocking partition wall PW2 may include a DBR structure layer PT and an insulating material layer IP1 stacked in an extending direction of the light-emitting element LE.

The DBR structure layer PT has a structure in which one or more pairs of the undoped GaN layer (PW-U) and the porous GaN layer (PW-NP) are alternately stacked. That is, the DBR structure layer PT formed by stacking one or more pairs of undoped GaN layers (PW-U) and porous GaN layers (PW-NP) vertically, that is, in the extension direction of the light-emitting element, may be located on the side surface of the light-emitting element LE.

The insulating material layer IP1 may be formed to fill the non-light-emitting area except for the DBR structure layer PT. The insulating material layer IP1 may include the organic insulating material to have a thickness (e.g., predetermined thickness). The organic insulating material may include, for example, an epoxy-based resin, an acrylic-based resin, a cardo-based resin, or an imide-based resin.

FIGS. 11 to 23 are cross-sectional views illustrating a method of manufacturing a display panel according to one or more embodiments.

Figure 11:
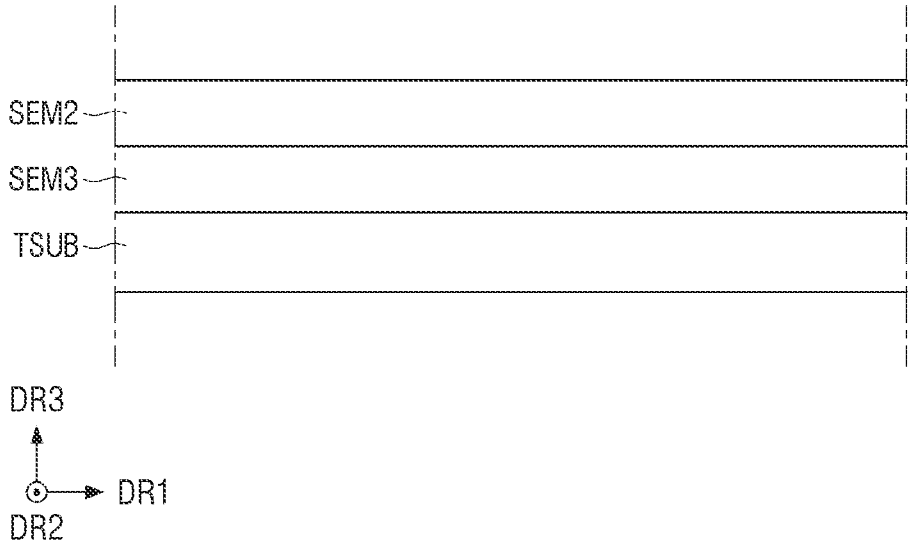
FIGS. 11 to 23 are cross-sectional views illustrating a method of manufacturing a display panel according to one or more embodiments.

Referring to FIG. 11, first, the target substrate TSUB is prepared. The target substrate TSUB may be a sapphire substrate Al2O3. However, the present disclosure is not limited thereto, and a case in which the target substrate TSUB is a sapphire substrate will be described in one or more embodiments.

A third semiconductor layer SEM3 and a second semiconductor layer SEM2 are formed on the target substrate TSUB. The third semiconductor layer SEM3 and the second semiconductor layer SEM2 grown by an epitaxial method may be formed by growing a seed crystal. Here, the methods of forming the third semiconductor layer SEM3 and the second semiconductor layer SEM2 may be electron beam deposition, physical vapor deposition (PVD), chemical vapor deposition (CVD), plasma laser deposition (PLD), dual-type thermal evaporation, sputtering, and metal-organic chemical vapor deposition (MOCVD), etc. and may be formed by chemical vapor deposition (MOCVD) in one or more embodiments. However, the present disclosure is not limited thereto.

A precursor material for forming the third semiconductor layer SEM3 and the second semiconductor layer SEM2 is not particularly limited within a range that may be generally selected to form a target material. For example, the precursor material may be a metal precursor including an alkyl group, such as a methyl group or an ethyl group. For example, it may be a compound, such as trimethyl gallium ($Ga(CH_3)_3$), trimethyl aluminum ($Al(CH_3)_3$), or triethyl phosphate ($(C_2H_5)_3PO_4$), but is not limited thereto.

For example, the third semiconductor layer SEM3 is formed on the target substrate TSUB. Although the drawing shows that the third semiconductor layer SEM3 is a single layer, the present disclosure is not limited thereto, and a plurality of layers may be formed. The third semiconductor layer SEM3 may be located to reduce a lattice constant difference between the second semiconductor layer SEM2 and the target substrate TSUB. For example, the third semiconductor layer SEM3 may include an undoped semiconductor, and may be a material that is not doped with n-type or p-type. In one or more embodiments, the third semiconductor layer SEM3 may be at least one of undoped InAlGaN, GaN, AlGaN, InGaN, AlN, and/or InN, but is not limited thereto.

The second semiconductor layer SEM2 is formed on the third semiconductor layer SEM3 using the above-described method.

The second semiconductor layer SEM2 may include a semiconductor material having a chemical formula of AlxGayIn1-x-yN(0≤x≤1, 0≤y≤1, 0≤x+y≤1). For example, it may be any one or more of AlGaInN, GaN, AlGaN, InGaN, AlN, and/or InN doped with n-type. The second semiconductor layer SEM2 may be doped with an n-type dopant, and the n-type dopant may be Si, Ge, Sn, or the like. For example, the second semiconductor layer SEM2 may be n-GaN doped with n-type Si.

Figure 12:
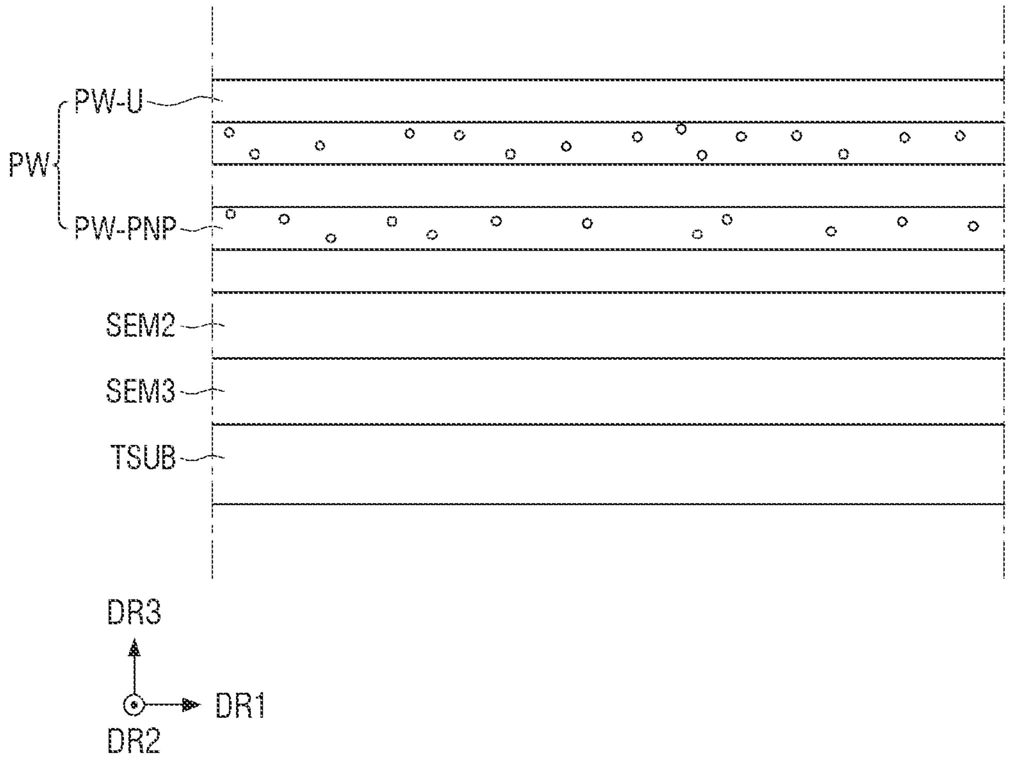
Figure 13:
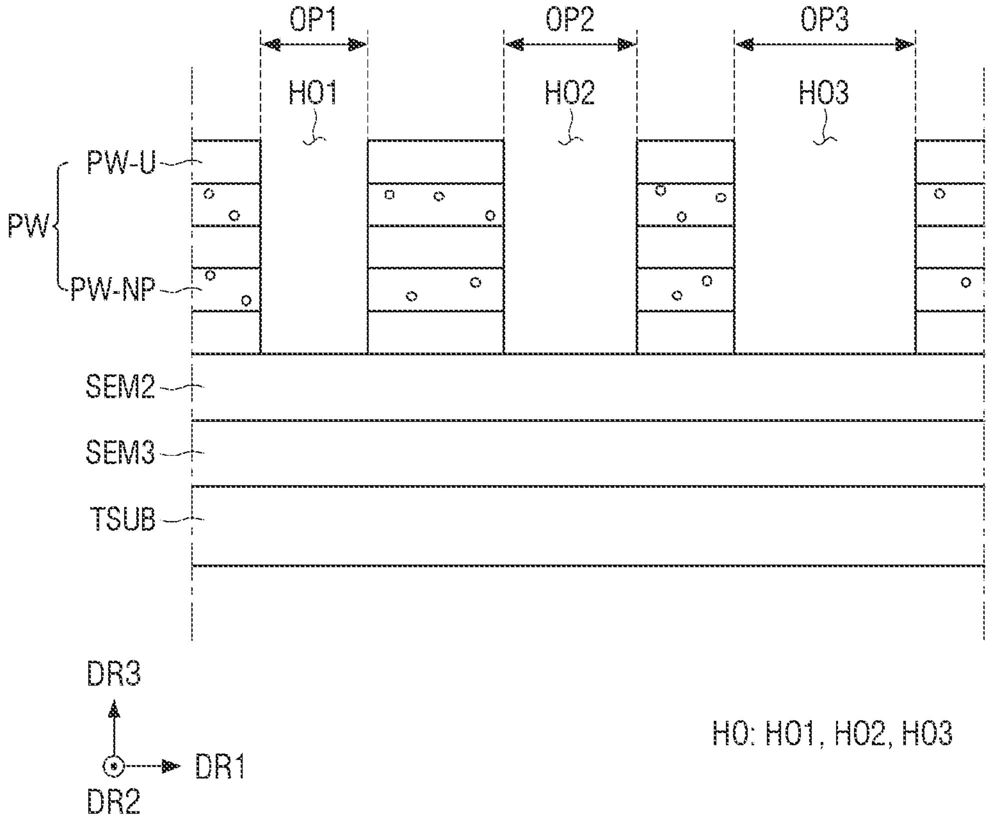

Next, referring to FIGS. 12 and 13, the light-blocking partition wall PW is formed on the second semiconductor layer SEM2.

First, referring to FIG. 12, a preliminary porous GaN layer (PW-PNP) is alternately repeatedly stacked on the undoped GaN layer (PW-U) on the second semiconductor layer (SEM2). At least two or more pairs of layers may be stacked. The preliminary porous GaN layer (PW-PNP) is a pre-composition layer of porous GaN (PW-NP), which will be described later, and may be a GaN layer doped with the n-type dopant. As the n-type dopant, silicon (Si), germanium (Ge), selenium (Se), or tellurium (Te) may be used. In one or more embodiments, silicon (Si) may be used.

At this time, the undoped GaN layer (PW-U) and the pre-porous GaN layer (PW-PNP) may be formed by methods, such as molecular beam epitaxy (MBE), hydride vapor phase epitaxy (HVPE), metal organic chemical vapor deposition (MOCVD), and liquid phase epitaxy, etc.

Next, referring to FIG. 13, the light-blocking partition wall PW including/defining a plurality of via holes HO is formed by patterning the alternately repeatedly stacked undoped GaN layer (PW-U) and pre-porous GaN layer (PW-PNP).

Here, a mask may be any material having an etch selectivity to the undoped GaN layer (PW-U) and the pre-porous GaN layer (PW-PNP). The mask is formed through chemical vapor deposition or physical vapor deposition.

A portion of the surface of the alternately repeatedly stacked undoped GaN layer (PW-U) and pre-porous GaN layer (PW-PNP) is exposed through selective etching on the mask. The pattern has a regular arrangement, and the shape of the pattern may have a circle or a square shape. The widths of the patterns may have different diameters. Accordingly, the plurality of via holes HO may have different diameters.

The plurality of via holes HO formed by the pattern may be formed through a conventional photolithography process and etching. In one or more embodiments, the diameter OP1 of the first via hole HO1 may be smaller than the diameter OP2 of the second via hole HO2, and the diameter OP2 of the second via hole HO2 may be smaller than the diameter of the third via hole HO3.

After the mask is removed, the side surfaces of the plurality of via holes HO are etched to form the porous GaN layer (PW-NP) from the preliminary porous GaN layer (PW-PNP). The side etching may be electrochemically etched using an etching solution including —OH groups. In the electrochemical etching of the pre-porous GaN layer (PW-PNP), the etching rate may be controlled by adjusting the doping concentration at a preset reference etching voltage. For example, if the doping concentration is increased to etch, the etch rate may be increased, and if the doping concentration is decreased to etch, the etch rate may be slowed down. The electrochemical etching may be performed by configuring the preliminary porous GaN layer (PW-PNP) as the anode and a platinum (Pt) electrode as the cathode, connecting the two electrodes to apply a voltage. The etching solution including the —OH group may be oxalic acid (C2H2O4-2H2O), sodium hydroxide (NaOH), or potassium hydroxide (KOH), but is not limited thereto.

The —OH group including in the etching solution bonds with the dangling bond of Ga of the preliminary porous GaN layer (PW-PNP). Thereafter, the GaN is combined with the —OH group in a chain to form $Ga_2O_3$, and the generated $Ga_2O_3$ is immediately dissolved in the etching solution upon formation. Accordingly, pores are formed, and the porous GaN layer (PW-NP) is formed from the preliminary porous GaN layer (PW-PNP).

The porous GaN layer (PW-NP) thus formed has an aspect of blocking dislocation defects propagating from the bottom. Accordingly, it is possible to suppress the occurrence of cracks when the GaN thin film is grown on a silicon substrate. In addition, there is an aspect that may improve light extraction efficiency by suppressing absorption of photons generated in the active layer due to the reflection of the porous GaN layer (PW-NP).

Referring to FIGS. 14 to 18, the porous semiconductor layer PSEM is formed in each of the plurality of via holes HO formed in FIG. 13.

Figure 14:
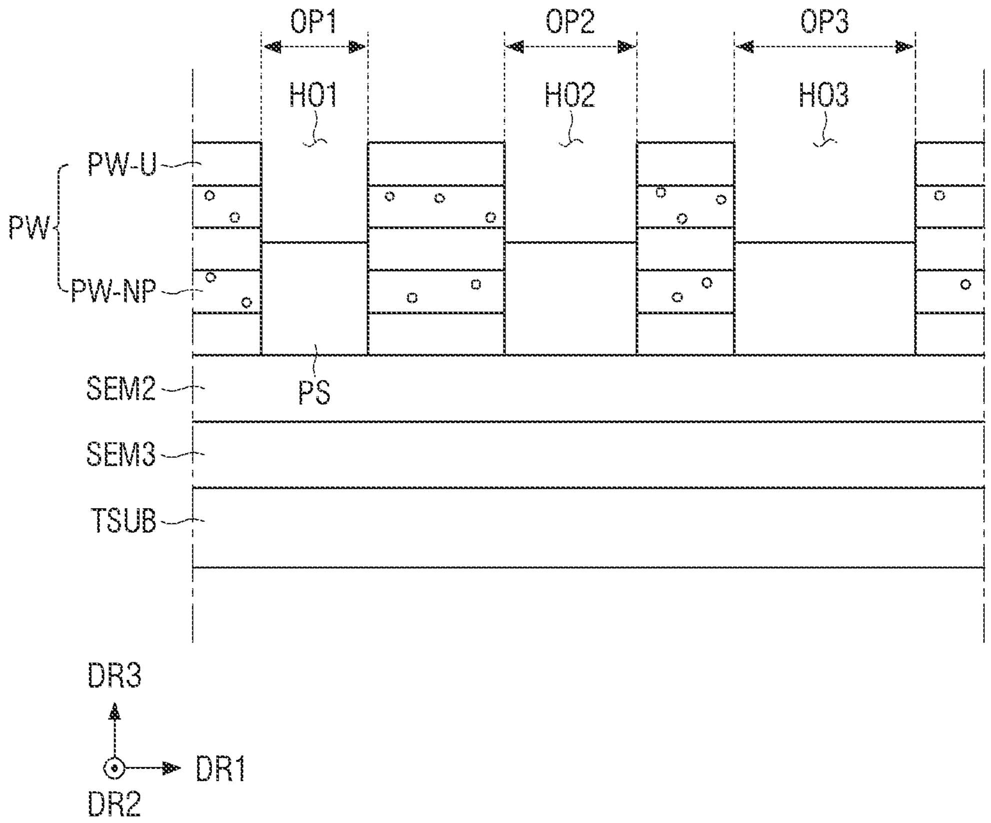
Figure 15:
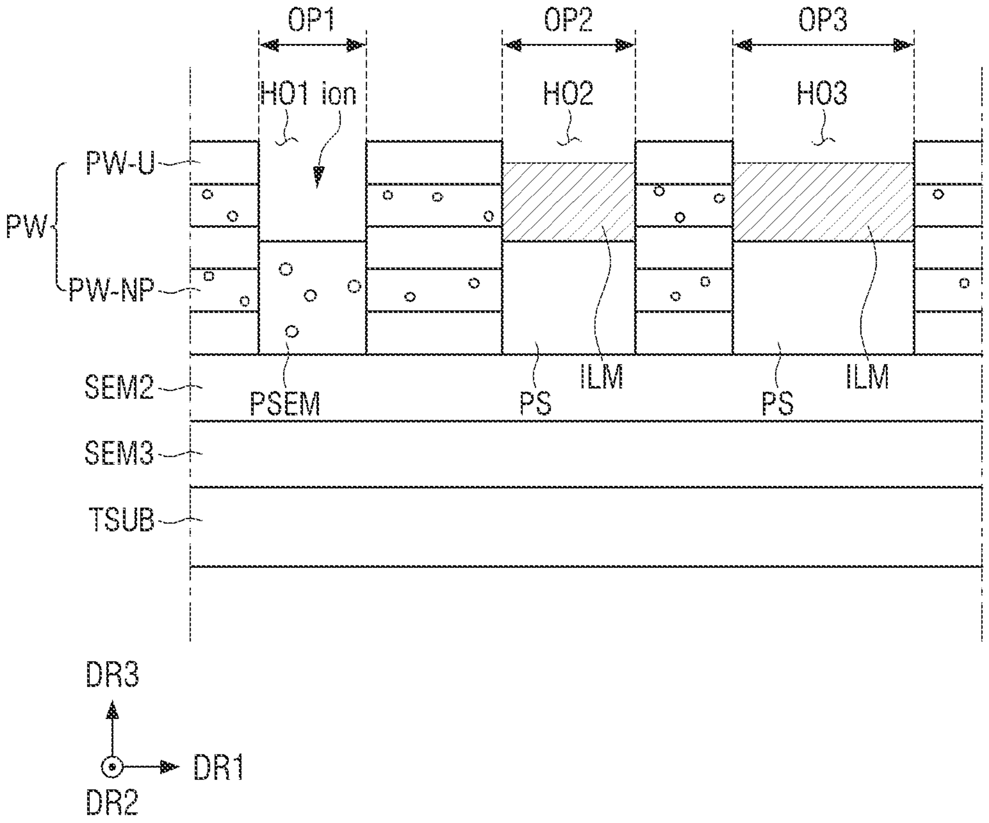

First, referring to FIG. 14, the second semiconductor layer SEM2 acts as a seed on the second semiconductor layer SEM2 exposed by the first hole HO1 whereby the preliminary porous semiconductor layer PS is further grown in the plurality of first holes HO1.

Next, the porous semiconductor layer PSEM is formed by adjusting the porosity of the preliminary porous semiconductor layer PS.

The longer the wavelength of the light-emitting element, the porosity of the porous semiconductor layer may be controlled to increase, and the control of the porosity may be adjusted by controlling the amount or time of implanted ions. In one or more embodiments, various amounts of ions may be implanted into the preliminary porous semiconductor layer PS to increase the porosity. For example, referring to FIG. 15, a first positive ion is implanted into the preliminary porous semiconductor layer PS formed in the first via hole HO1 after masking the second via hole HO2 and the third via hole HO3. An insulating mask ILM may be used for masking.

Figure 16:
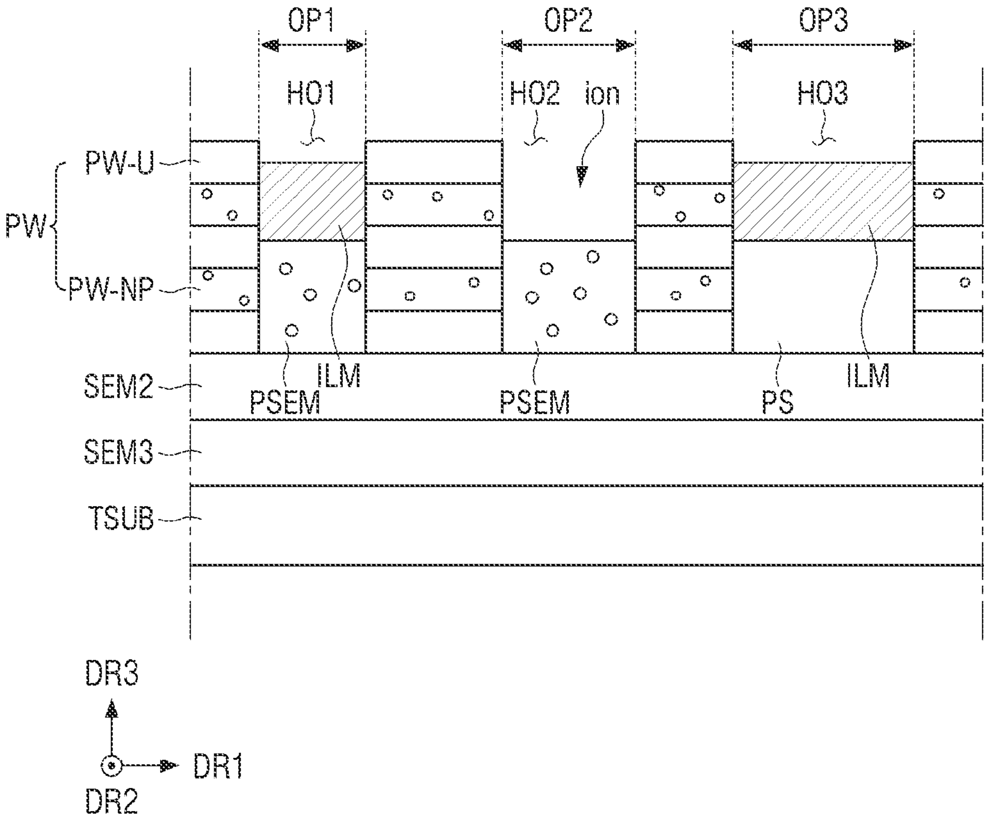

Thereafter, as shown in FIG. 16, after removing the insulating mask ILM of the second via hole HO2, and after masking the first via hole HO1 and the third via hole, a second positive ion is implanted into the preliminary porous semiconductor layer PS formed in the second via hole HO2.

Figure 17:
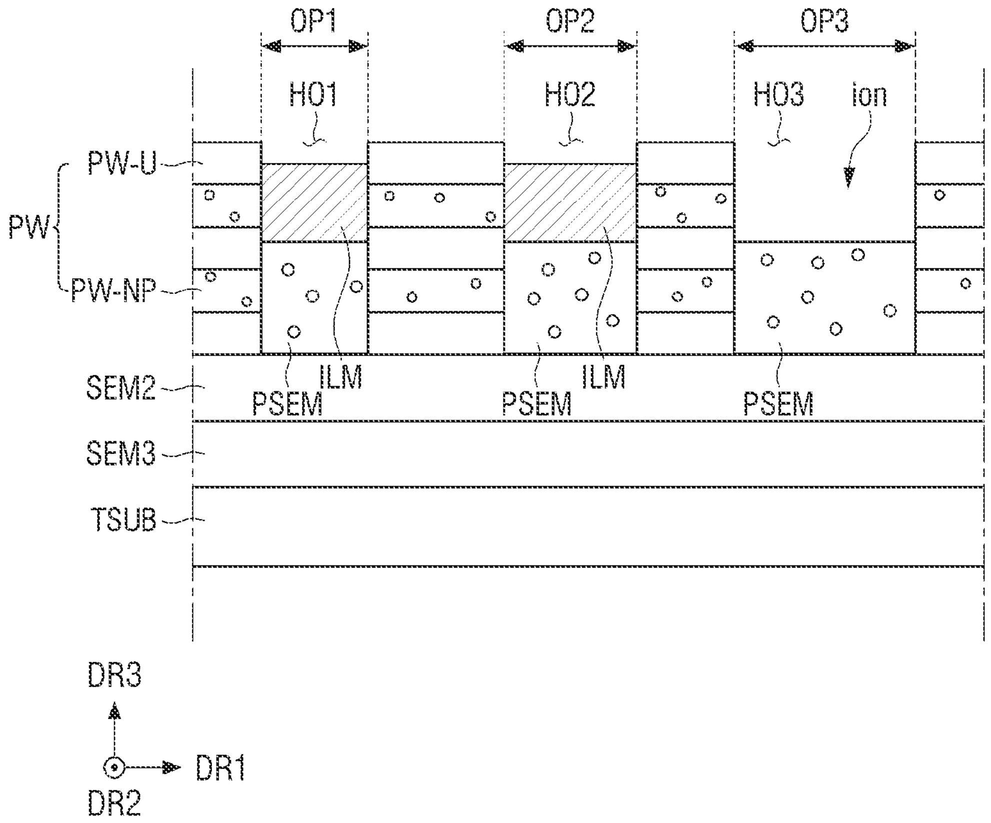
Figure 18:
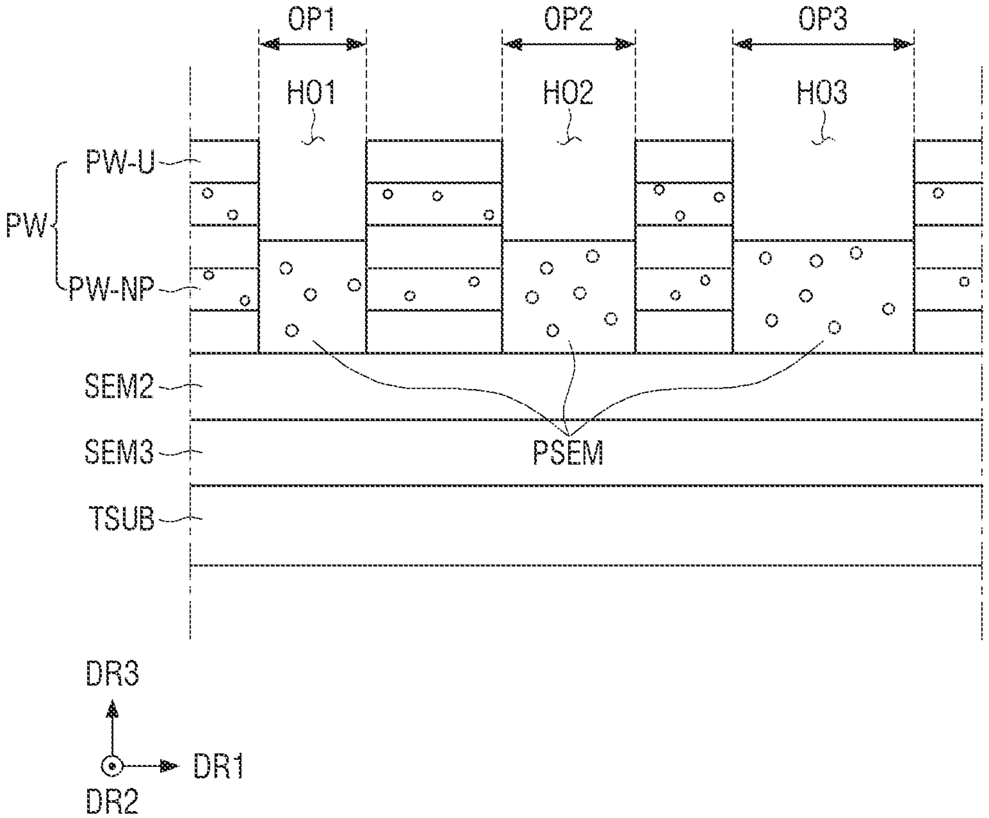

Next, as shown in FIG. 17, after removing the insulating mask ILM of the third via hole HO3, and after masking the first via hole HO1 and the second via hole HO2, a third amount of ions may be implanted into the preliminary porous semiconductor layer PS formed in the third via hole HO3. The third amount may be greater than the second amount, and the second amount may be greater than the first amount.

Due to the difference in porosity of the porous semiconductor layer PS formed as described above, the porous semiconductor layers PS formed in the via holes HO of different sizes may bring different degrees of strain relaxation. For example, the porous semiconductor layer PSEM formed in the third via hole HO3 into which a largest amount of ions (of the first to third via holes HO1, HO2, and HO3) may be implanted has a greater degree of strain relaxation than the porous semiconductor layer PSEM formed in the first via hole HO1, into which the smallest amount of ions is implanted. For this reason, a light-emitting wavelength is set so that the light sources formed in the porous semiconductor layer PSEM formed in the third via hole HO3 may have a longer emitting wavelength than the light sources formed in the porous semiconductor layer PSEM formed in the first via hole HO1.

Figure 19:
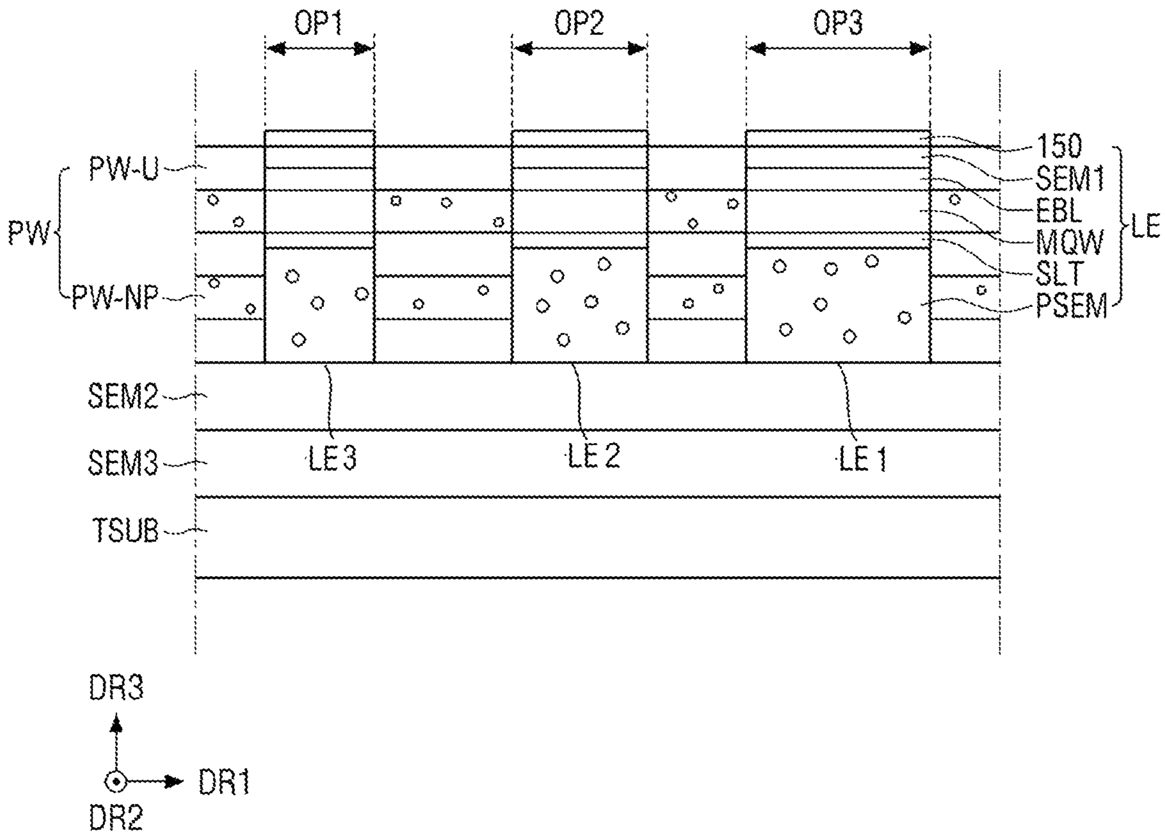

Next, referring to FIG. 19, the active layer MQW, the first semiconductor layer SEM1, and the connection electrode 150 are formed on the porous semiconductor layer PSEM to form the light-emitting element LE.

The superlattice layer SLT, the active layer MQW, the electron-blocking layer EBL, and the first semiconductor layer SEM1 are sequentially formed on the porous semiconductor layer PSEM by using the above-described epitaxial method. The active layer MQW may be formed of a different material for each hole. For example, the active layer MQW corresponding to the first light-emitting element LE1, the active layer MQW corresponding to the second light-emitting element LE2, and the active layer MQW corresponding to the third light-emitting element LE3 may be respectively formed of different materials to emit light of different colors. The first light-emitting element LE1 may emit a red first light, the second light-emitting element LE2 may emit a green second light, and the third light-emitting element LE3 may emit a third blue light.

Next, the connection electrode 150 is deposited on the first semiconductor layer SEM1. The connection electrode 150 may be formed to protrude above the upper surface of the partition wall PW.

Figure 20:
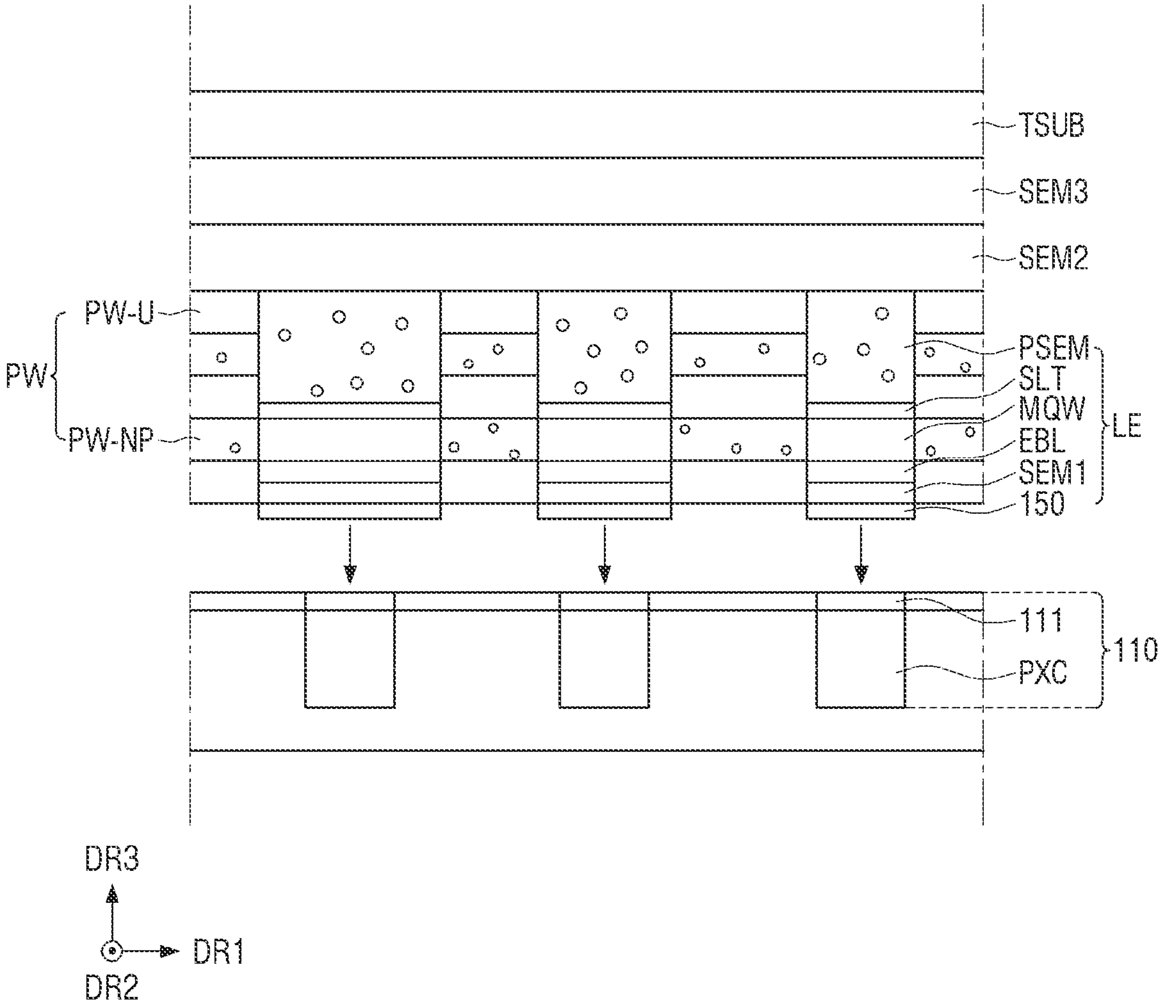
Figure 21:
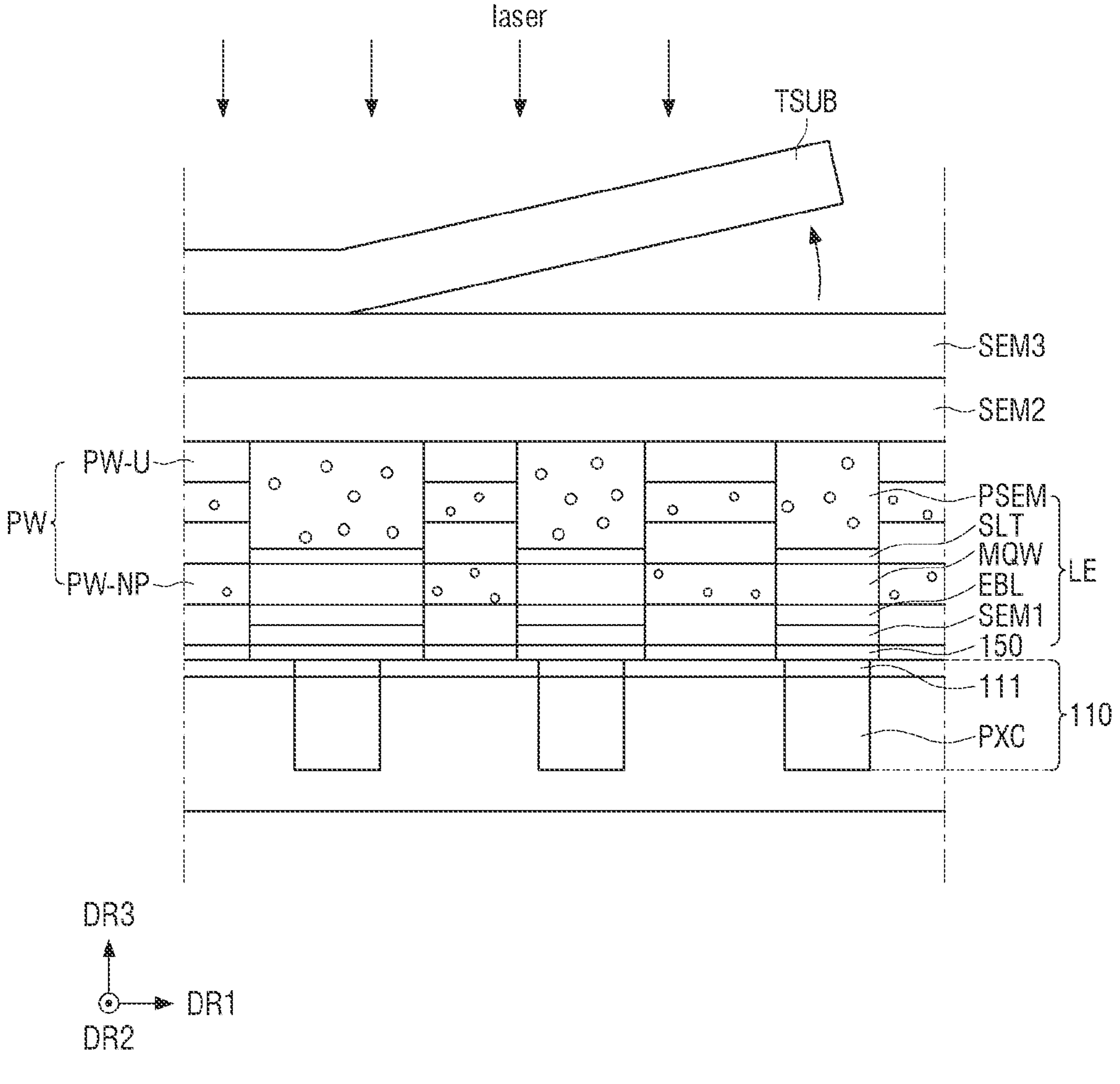

Next, referring to FIGS. 20 and 21, the light-emitting element layer 120 is bonded to the semiconductor circuit board 110 and the target substrate TSUB is separated.

First, referring to FIG. 20, the semiconductor circuit board 110 is prepared. The semiconductor circuit board 110 may include the plurality of pixel circuit units PXC and the pixel electrode 111.

For example, the pixel electrode 111 is formed on the semiconductor circuit board 110 on which the plurality of pixel circuit units PXC are formed. Next, the target substrate TSUB is aligned on the semiconductor circuit board 110. Alignment keys may be respectively located on the semiconductor circuit board 110 and the target substrate TSUB to align the semiconductor circuit board 110 and the target board TSUB. Next, the semiconductor circuit board 110 and the target substrate TSUB are bonded together.

For example, the pixel electrode 111 of the semiconductor circuit board 110 and the connection electrode 150 of each of the light-emitting devices LE1, LE2, and LE3 are brought into contact with each other. Next, each light-emitting elements LE1, LE2, and LE3 is bonded to the semiconductor circuit board 110 by fusion bonding the pixel electrodes 111 and the connection electrodes 150 at a temperature (e.g., predetermined temperature). In this case, a filler (NCP of FIG. 8) for eutectic bonding may be applied between the semiconductor circuit board 110 and the target substrate TSUB. The filler NCP may be filled between the semiconductor circuit board 110 and the light-emitting elements LE1, LE2, and LE3, or between the semiconductor circuit board 110 and the target substrate TSUB.

Next, referring to FIG. 21, the target substrate TSUB is separated. For example, the target substrate TSUB is separated from the third semiconductor layer SEM3. The process of separating the target substrate TSUB may be separated by a laser lift-off (LLO) process. The laser lift-off process may use a laser, and a KrF excimer laser (about 248 nm wavelength) may be used as a source. The energy density of the excimer laser is irradiated in the range of about 550 mJ/cm$^2$ to about 950 mJ/cm$^2$, and the incident area may be in the range of about 50×50 μm$^2$ to about 1×1 cm$^2$ but is not limited thereto.

Figure 22:
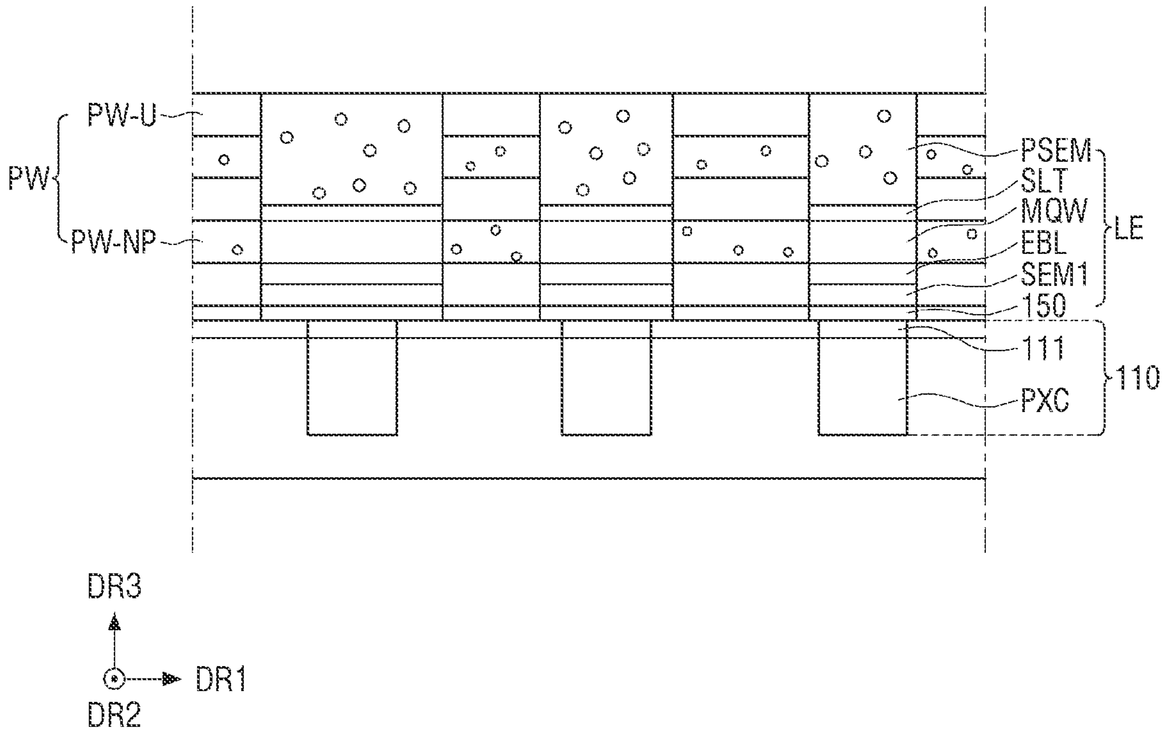

Next, referring to FIG. 22, the second semiconductor layer SEM2 and the third semiconductor layer SEM3 are etched and removed from the semiconductor circuit board 110 to which the light-emitting element LE is bonded.

The etching process may use the same process as the above-described etching process of the semiconductor material layer. The porous semiconductor layer PSEM of each light-emitting element LE may be exposed by the etching process.

Figure 23:
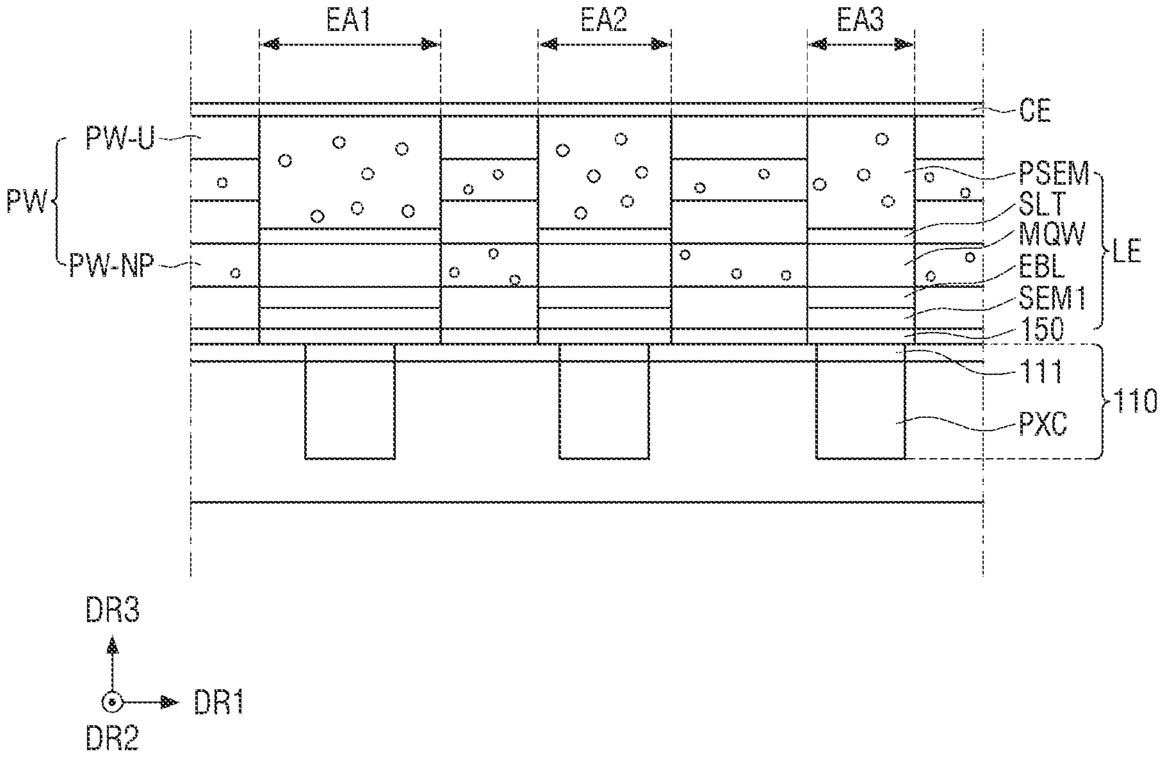

Next, as shown in FIG. 23, the common electrode CE is deposited on the light-emitting element LE. The common electrode CE may be entirely formed on (e.g., may be formed on an entirety of) the plurality of light-emitting elements LE and the light-blocking partition wall PW.

FIGS. 24 to 32 are cross-sectional views illustrating a method of manufacturing the display panel shown in FIG. 9.

Figure 24:
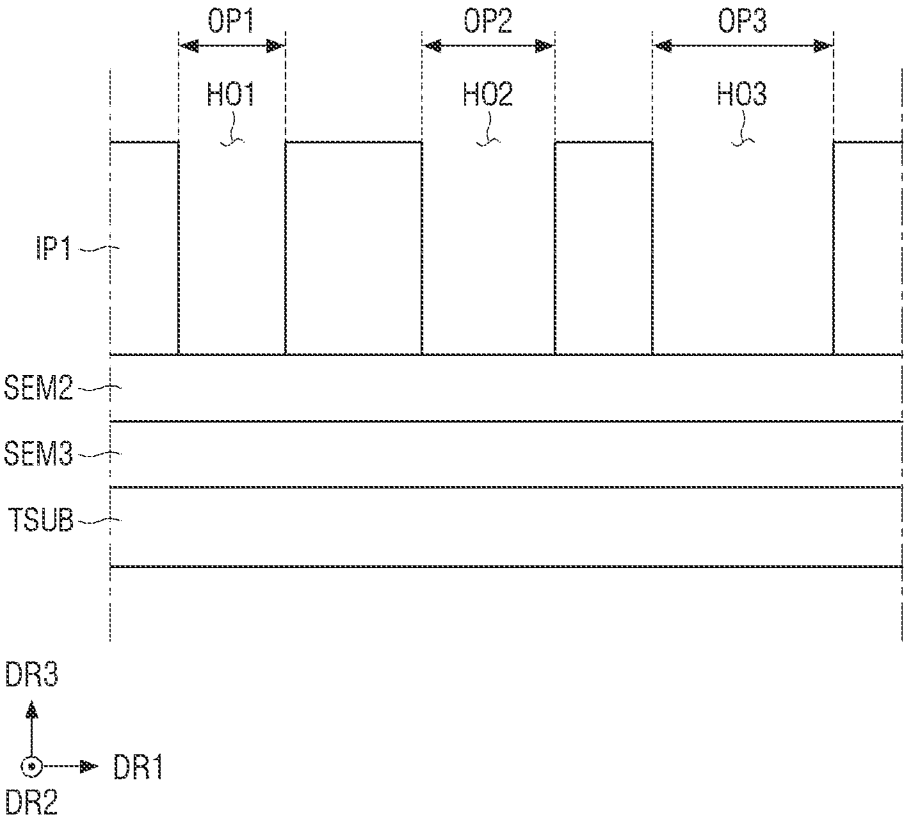
FIGS. 24 to 32 are cross-sectional views illustrating a method of manufacturing the display panel shown in FIG. 9.

As described above with reference to FIG. 11, after forming the third semiconductor layer SEM3 and the second semiconductor layer SEM2 on the target substrate TSUB, referring to FIG. 24, the first insulating layer IP1 including the plurality of via holes HO is formed on the second semiconductor layer SEM2.

First, it may be formed by coating or immersing the insulating material on the target substrate TSUB on the second semiconductor layer SEM2. For example, the insulating material may be formed by atomic layer deposition ALD.

Next, the plurality of via holes HO are formed in the first insulating member using a mask pattern. The pattern has a regular arrangement, and the shape of the pattern may have a circle or a square shape. The widths of the patterns may have different diameters. Accordingly, the plurality of via holes HO may have different diameters.

The plurality of via holes HO formed by the pattern may be formed through a conventional photolithography process and etching. In one or more embodiments, the diameter OP1 of the first via hole HO1 may be smaller than the diameter OP2 of the second via hole HO2, and the diameter OP2 of the second via hole HO2 may be smaller than the diameter of the third via hole HO3.

Thereafter, the mask may be removed by the above-described etching method.

Figure 25:
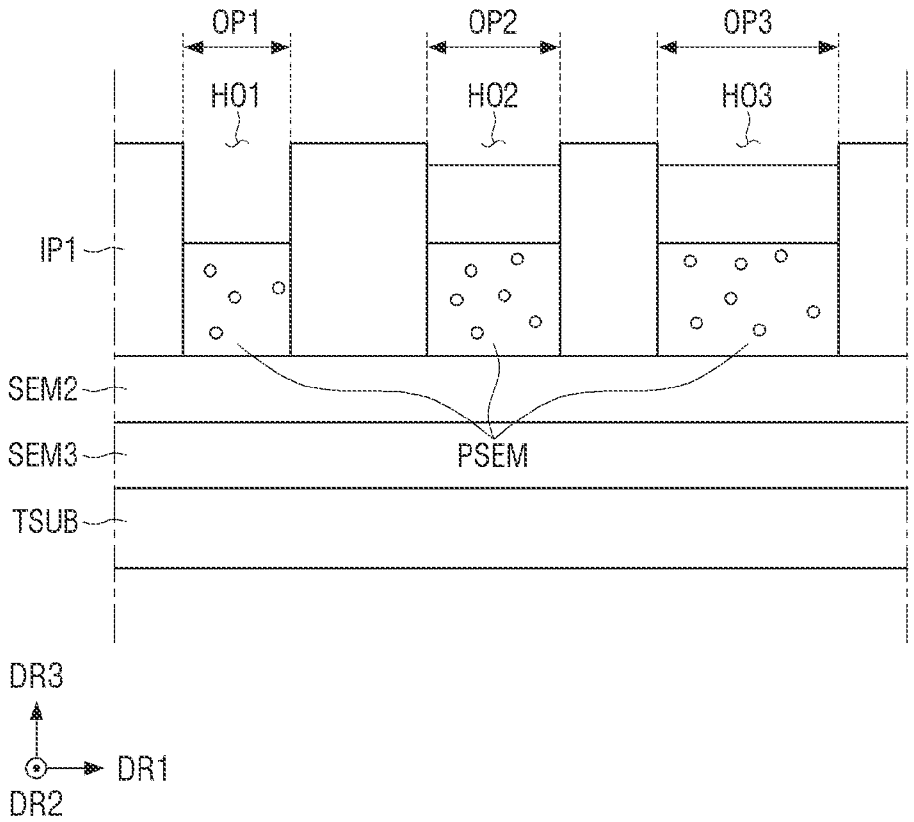

Next, referring to FIG. 25, the porous semiconductor layer PSEM is formed in each of the formed via holes HO.

Because the formation of the porous semiconductor layer PSEM is similar to that described with reference to FIGS. 14 to 18, a redundant description will be omitted.

Figure 26:
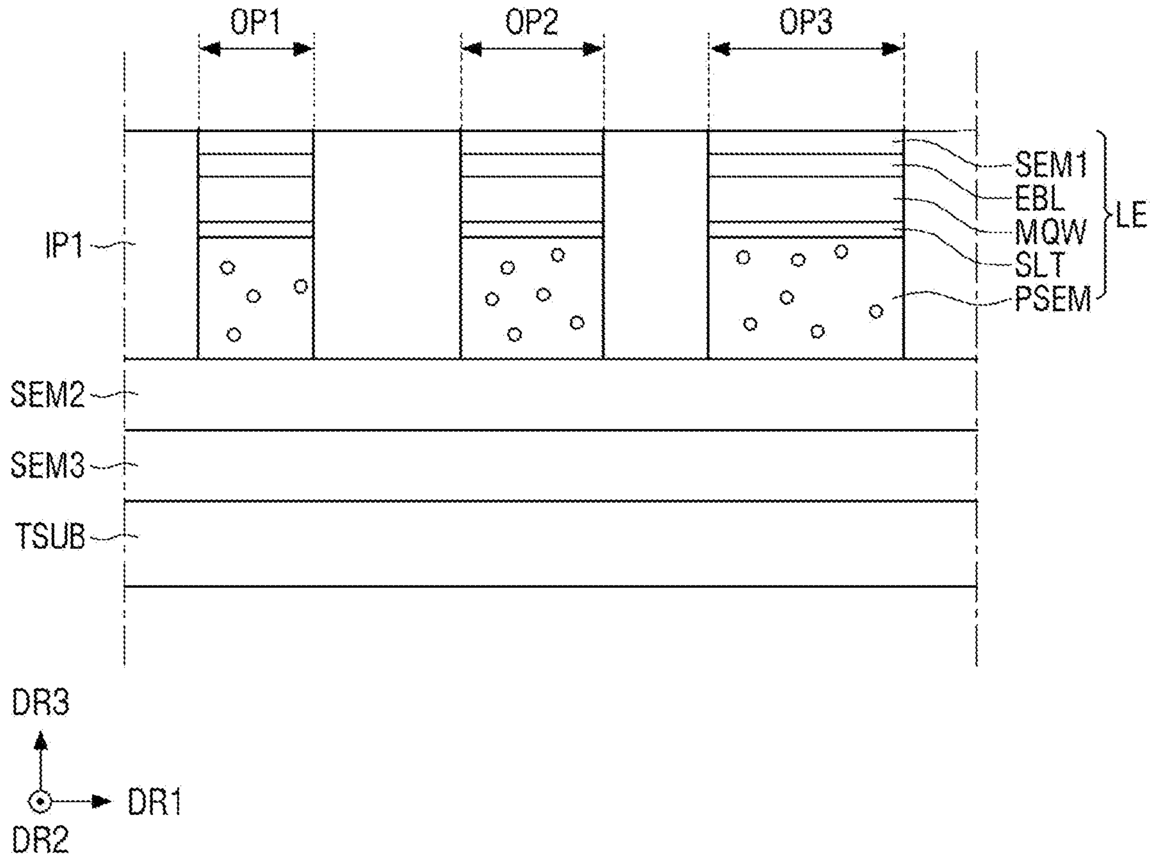

Next, referring to FIG. 26, the light-emitting element LE is formed by forming the active layer MQW and the first semiconductor layer SEM1 on the porous semiconductor layer PSEM. Because the process of FIG. 26 is similar to that described with reference to FIG. 19, a redundant description will be omitted.

Figure 27:
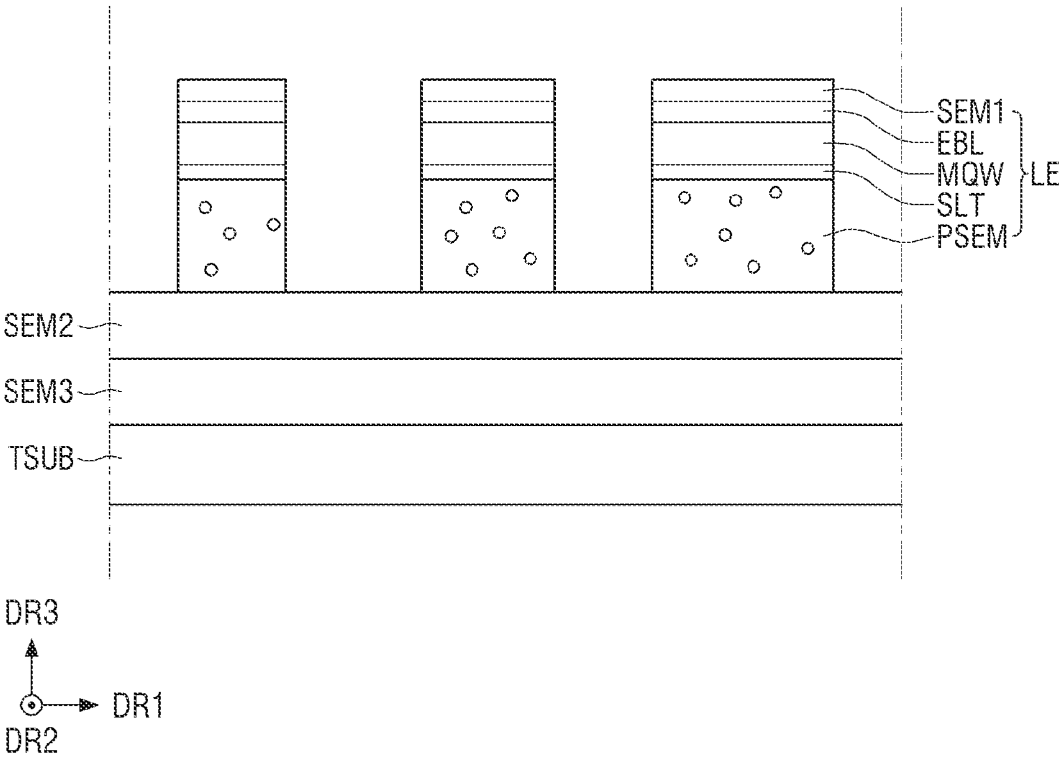
Figure 28:
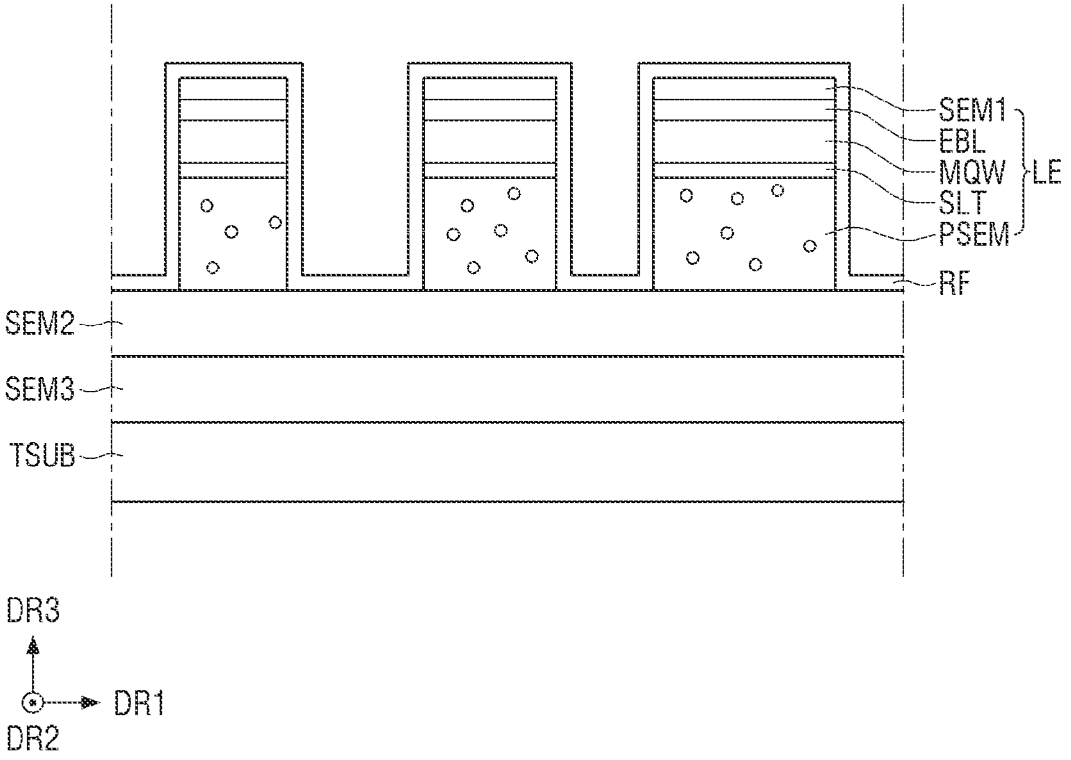
Figure 29:
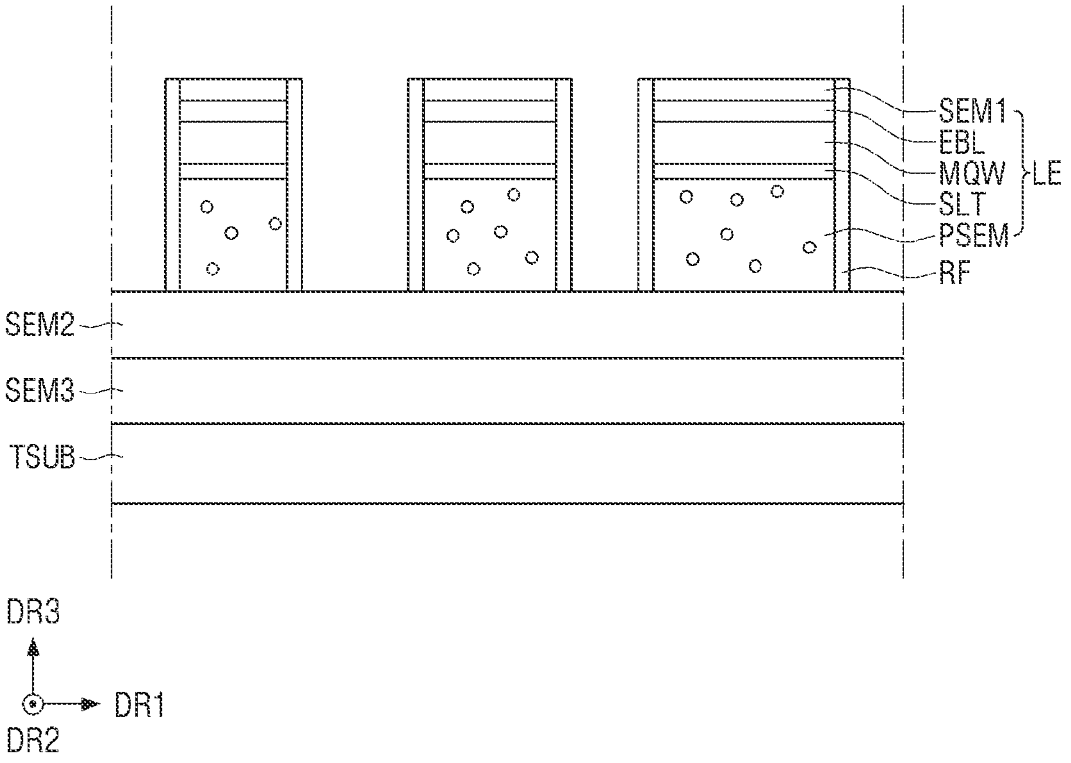

Thereafter, referring to FIGS. 27 to 29, the reflective layer RF is formed after the first insulating layer IP1 is removed by etching.

After the first insulating layer IP1 is etched and removed as shown in FIG. 27, a reflective material layer RFL is formed on the light-emitting element LE and the second semiconductor layer SEM2 on which the light-emitting element LE is not located, as shown in FIG. 28. The reflective material layer RFL may include a metal having high reflectivity, such as aluminum (Al). The reflective material layer RFL may be formed by a metal deposition method, such as sputtering described above. The reflective material layer RFL may be entirely stacked on a first insulating layer INS1 and the plurality of light-emitting elements LE.

Next, referring to FIG. 29, the reflective material layer RFL is etched to form the reflective layer RF. The reflective layer RF may be located on side surfaces of the plurality of light-emitting elements LE. In addition, the reflective layer RF may be formed to be spaced apart from each other between the adjacent light-emitting elements LE.

Figure 30:
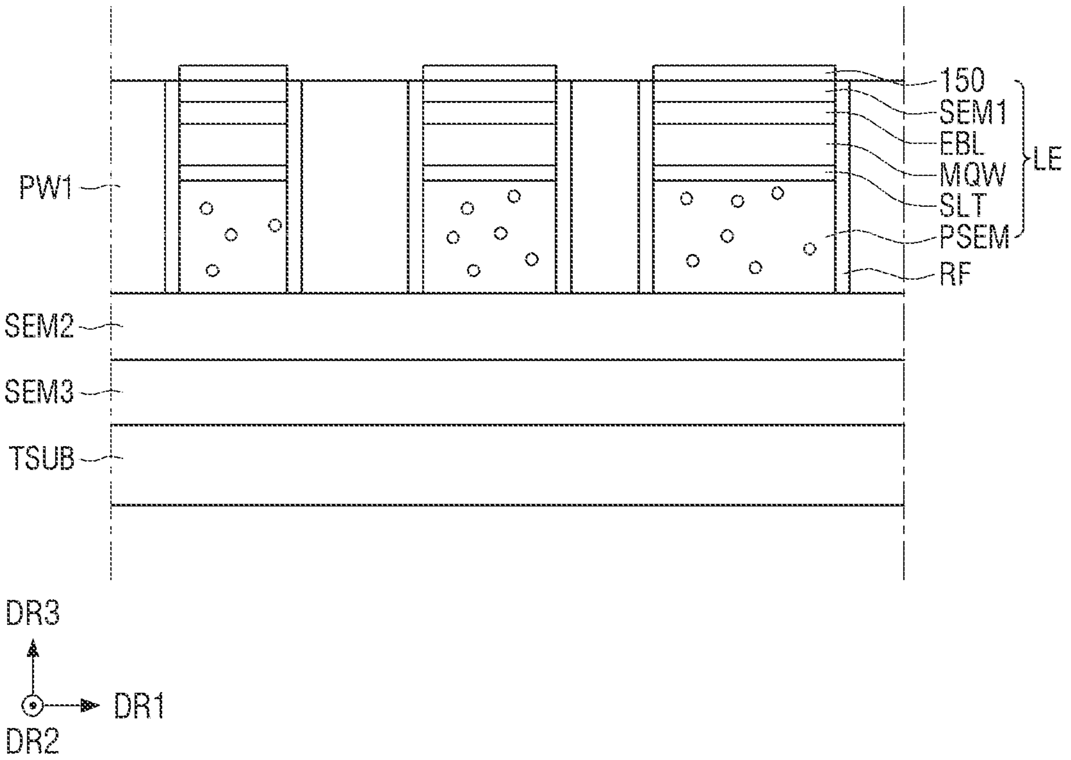

Next, referring to FIG. 30, the light-blocking partition wall PW and the connection electrode 150 are formed.

First, the partition wall PW1 may be formed by filling the insulating material between the light-emitting elements LE, and the ohmic contact layer may be formed on the plurality of light-emitting elements LE.

For example, ohmic contact layers and connection electrodes 150 are formed on the plurality of light-emitting elements LE. The ohmic contact layers may be directly formed on the upper surface of the first semiconductor layer SEM1 of each light-emitting element LE. The connection electrodes 150 are formed on the ohmic contact layer.

Figure 31:
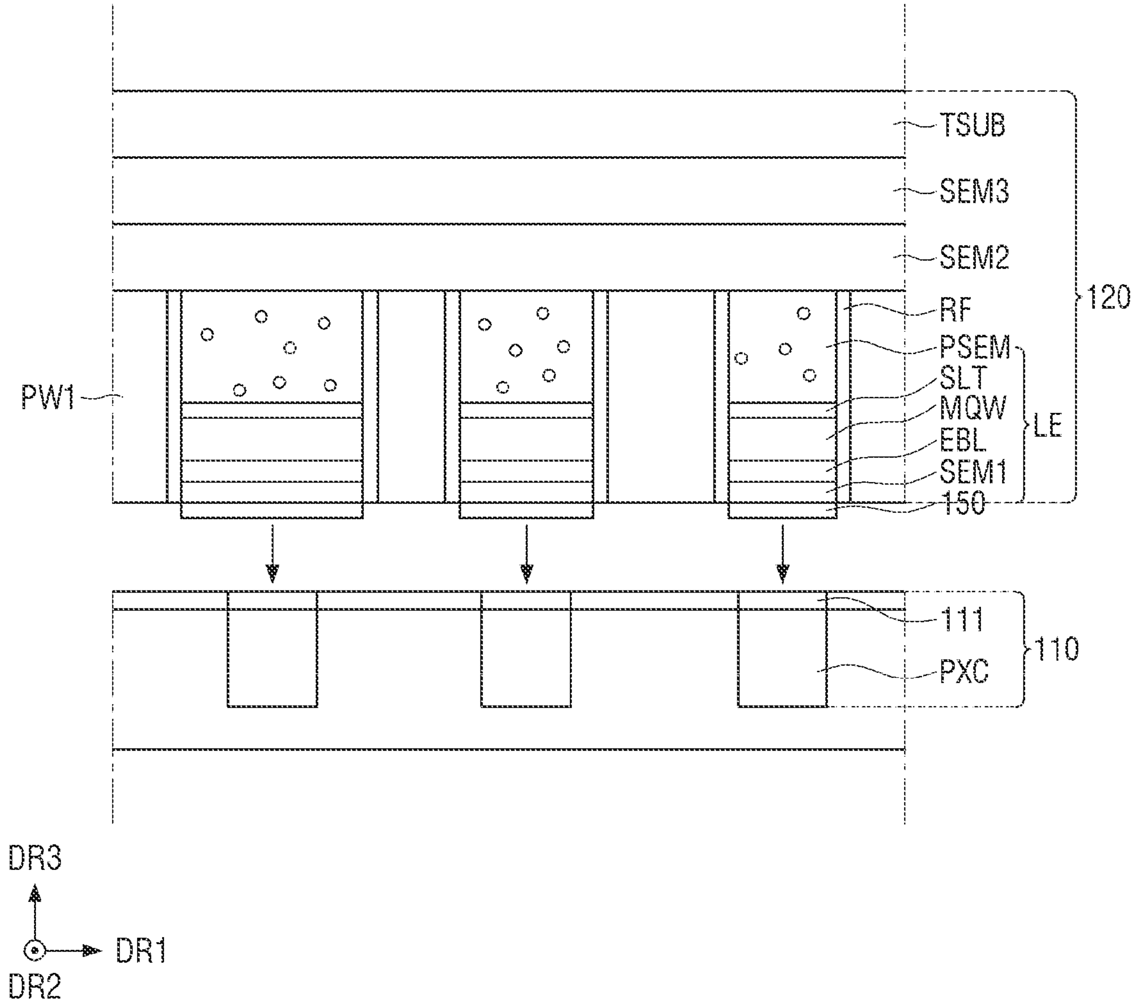

Next, referring to FIG. 31, the plurality of light-emitting elements LE are bonded to the semiconductor circuit board 110 and the target substrate TSUB is separated.

Figure 32:
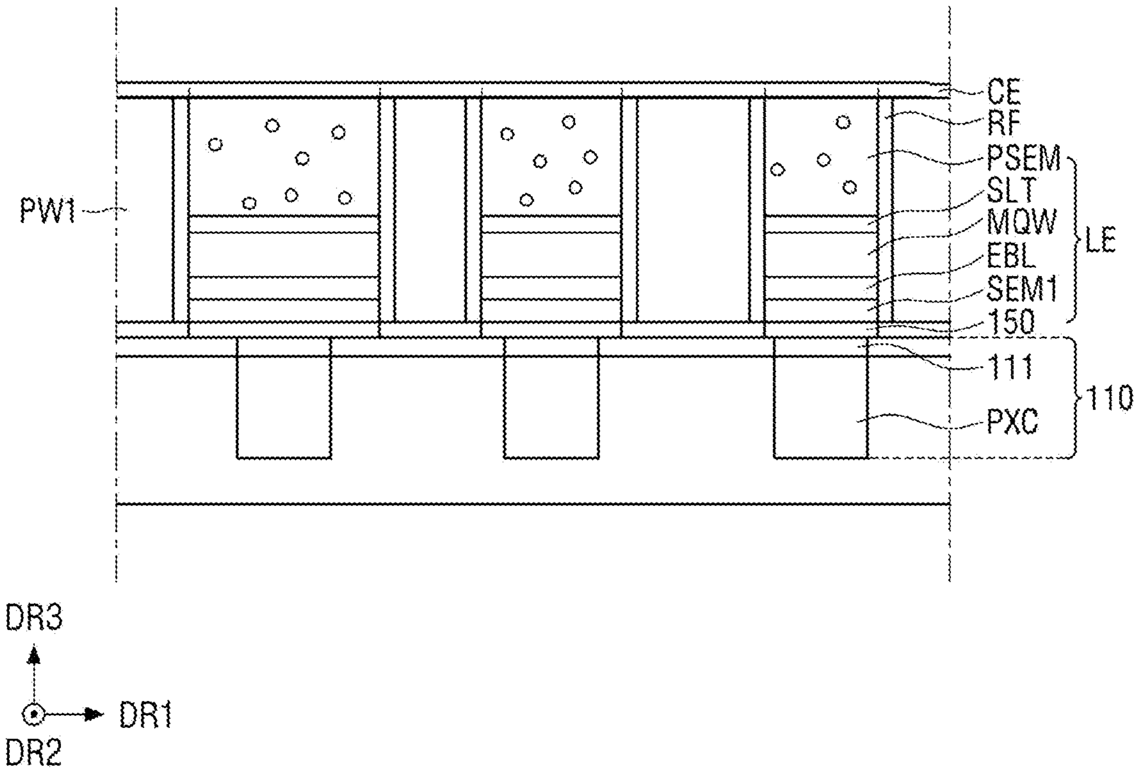

Referring to FIG. 32, the second semiconductor layer SEM2 and the third semiconductor layer SEM3 are etched and removed from the semiconductor circuit board 110 to which the light-emitting element LE is bonded, and the common electrode CE is formed. The common electrode CE may be entirely formed on the plurality of light-emitting elements LE and the light-blocking partition wall PW1.

Figure 33:
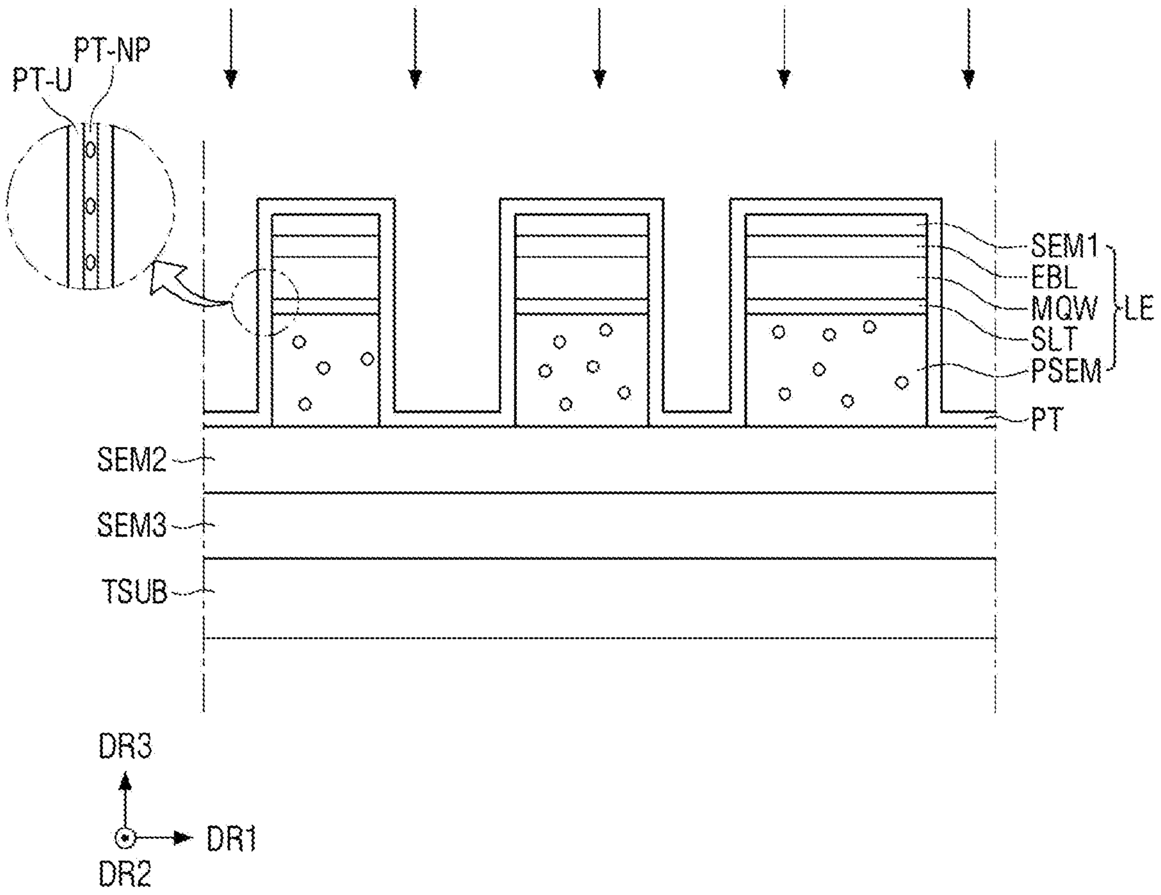
FIGS. 33 and 36 are cross-sectional views illustrating a method of manufacturing the display panel shown in FIG. 10.
Figure 36:
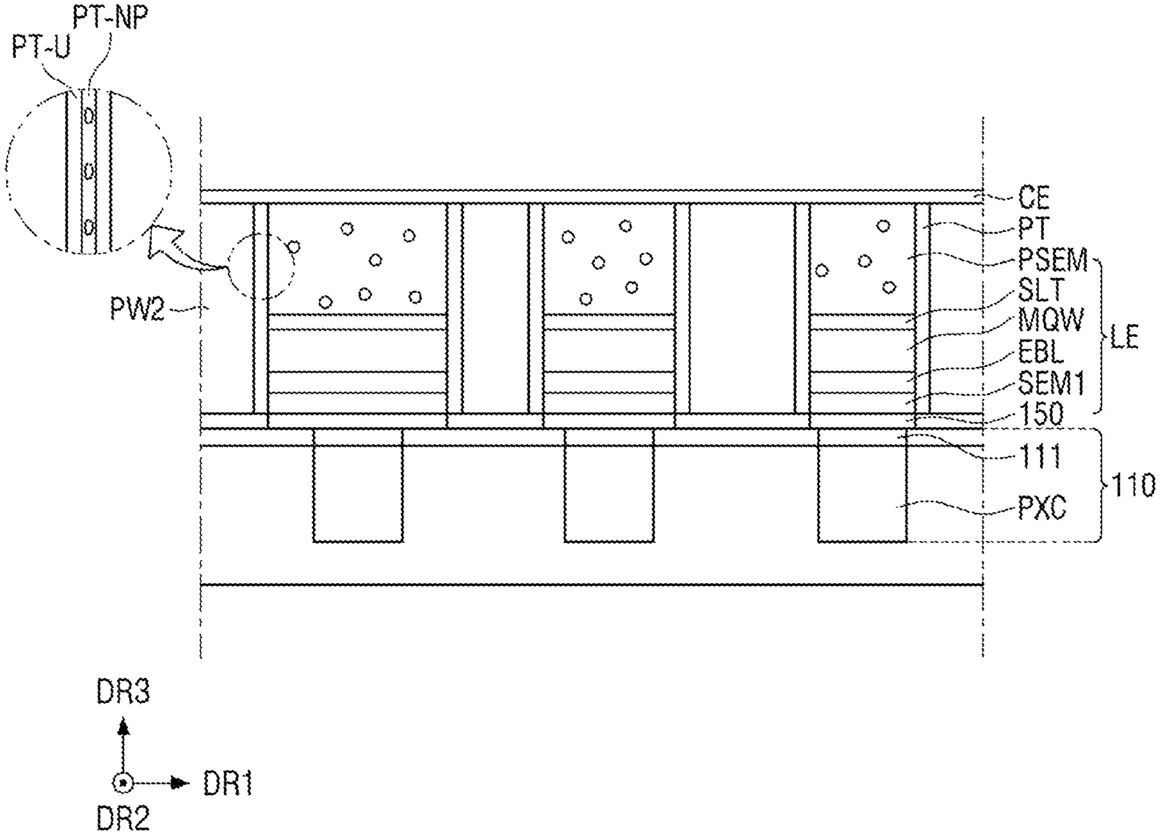

FIGS. 33 and 36 are cross-sectional views illustrating a method of manufacturing the display panel shown in FIG. 10.

First, referring to FIGS. 24 to 27, the third semiconductor layer SEM3 and the second semiconductor layer SEM2 are formed on the target substrate TSUB, and then the first insulating layer IP1 including the plurality of via holes HO is formed. Next, the porous semiconductor layer PSEM is formed in each of the plurality of via holes HO. Thereafter, the active layer MQW and the first semiconductor layer SEM1 are formed on the porous semiconductor layer PSEM to form the light-emitting element LE. Next, the first insulating layer IP1 is etched and removed. Because this process is similar to the method described in detail with reference to FIGS. 24 to 27, a redundant description will be omitted.

Referring to FIG. 33, the preliminary porous GaN layer (PW-PNP) is alternately stacked repeatedly on the undoped GaN layer (PW-U) on the light-emitting element LE and on the second semiconductor SEM2 on which the light-emitting element LE is not located. The preliminary porous GaN layer (PW-PNP) is a pre-composition layer of porous GaN (PW-NP), which will be described later, and may be a GaN layer doped with an n-type dopant. Silicon (Si), germanium (Ge), selenium (Se), or tellurium (Te) may be used as the n-type dopant, and silicon (Si) may be used in one or more embodiments.

At this time, the undoped GaN layer (PW-U) and the pre-porous GaN layer (PW-PNP) may be formed by methods, such as molecular beam epitaxy (MBE), hydride vapor phase epitaxy (HVPE), metal organic chemical vapor deposition (MOCVD), and liquid phase epitaxy, etc.

Then, a large voltage difference is formed in the third direction DR3 without a separate mask, and the undoped GaN layer (PW-U) and the pre-porous GaN layer (PW-PNP) are etched using an etching material. In this case, the etching material moves in the third direction DR3 by voltage control, that is, it moves from top to bottom to etch the undoped GaN layer (PW-U) and the pre-porous GaN layer (PW-PNP).

Figure 34:
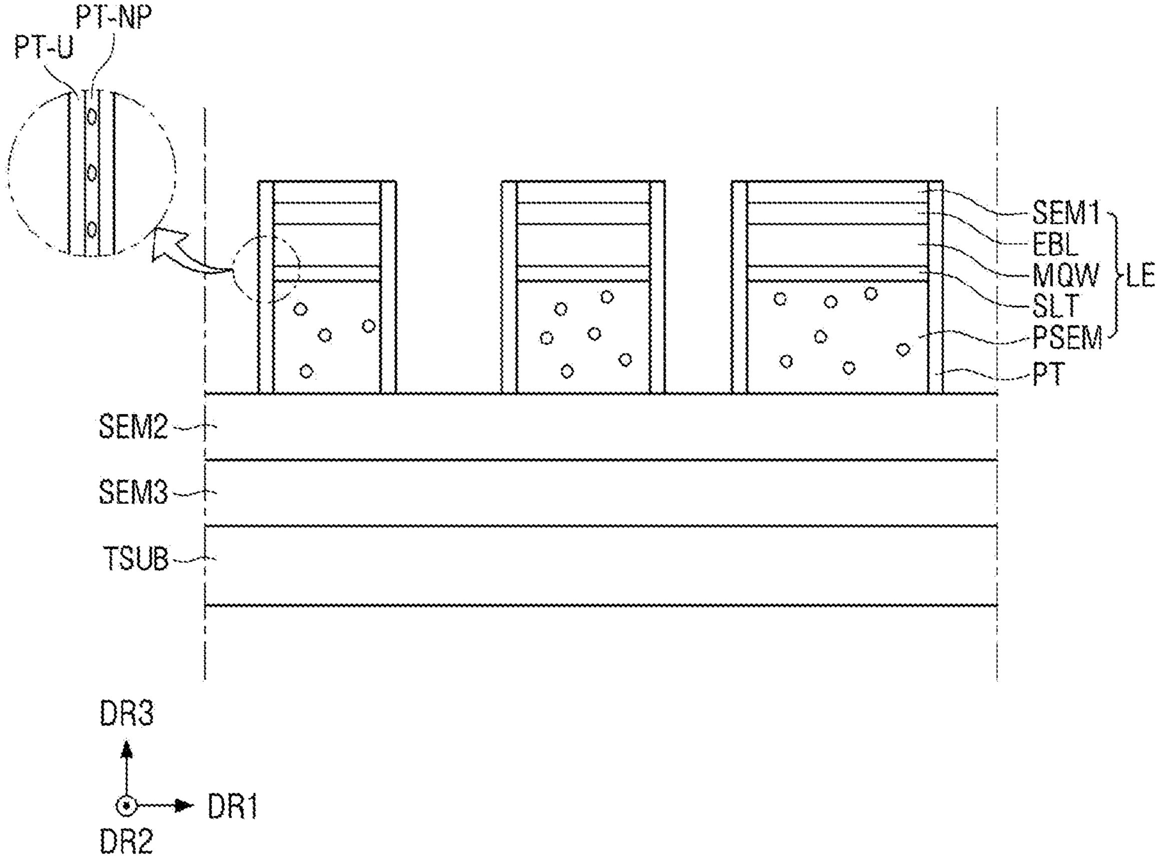

For this reason, as shown in FIG. 34, the undoped GaN layer (PW-U) and the pre-porous GaN layer (PW-PNP) located on a horizontal plane defined by the first direction DR1 and the second direction DR2 are removed. In comparison, the undoped GaN layer (PW-U) and the pre-porous GaN layer (PW-PNP) located on a vertical plane defined by the third direction DR3 may not be removed. Therefore, the undoped GaN layer (PW-U) and the preliminary porous GaN layer (PW-PNP) located on the upper surface of the light-emitting elements LE and the second semiconductor SEM2 on which the light-emitting element LE is not located may be removed. The undoped GaN layer PW-U and the pre-porous GaN layer PW-PNP located on the side surfaces of the light-emitting elements LE might not be removed. Accordingly, the undoped GaN layer (PW-U) and the pre-porous GaN layer (PW-PNP) may be located on each side surface of the light-emitting elements LE. A portion of the surface of the alternately repeatedly stacked undoped GaN layer (PW-U) and pre-porous GaN layer (PW-PNP) is exposed. The porous GaN layer (PW-NP) is formed from the preliminary porous GaN layer (PW-PNP) by performing electrochemical etching through the partially exposed surface. Through this process, the undoped GaN layer (PW-U) and the porous GaN layer (PW-NP) may be vertically stacked on the side surface of the light-emitting element LE. The undoped GaN layer (PW-U) and the porous GaN layer (PW-NP) may be alternately stacked.

Due to the reflection of the thus formed porous GaN layer (PW-NP), absorption of photons generated in the active layer is suppressed, thereby improving light extraction efficiency.

Figure 35:
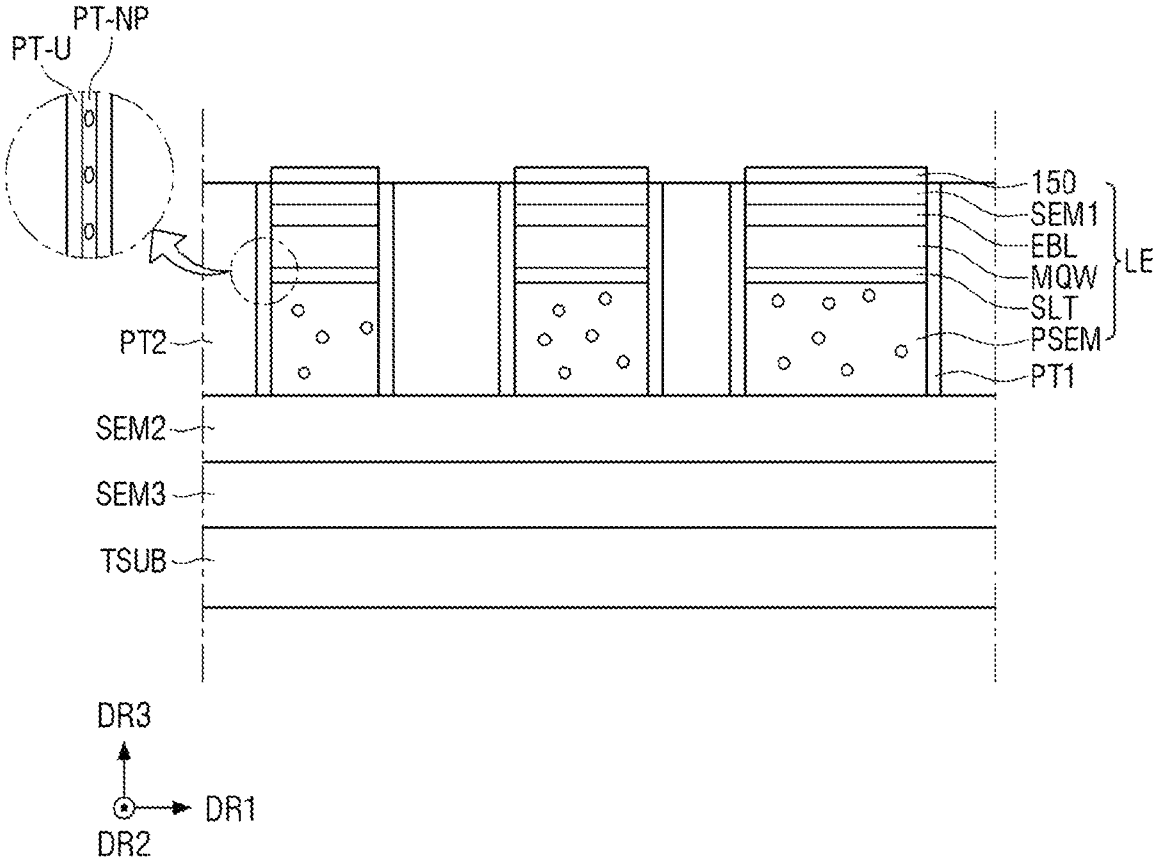

Next, referring to FIG. 35, the light-blocking partition wall PW and the connection electrode 150 are formed.

First, the partition wall PW1 is formed by filling the insulating material between the light-emitting elements LE, and ohmic contact layers and connection electrodes 150 are formed on the plurality of light-emitting elements LE.

For example, ohmic contact layers and connection electrodes 150 are formed on the plurality of light-emitting elements LE. The ohmic contact layers may be directly formed on the upper surface of the first semiconductor layer SEM1 of each light-emitting element LE. The connection electrodes 150 may be formed on the ohmic contact layer.

Next, referring to FIG. 36, the plurality of light-emitting elements LE are bonded to the semiconductor circuit board 110 to form the common electrode CE.

For example, the semiconductor circuit board 110 to which the plurality of light-emitting elements LE are bonded and the target substrate TSUB are separated. Next, the second semiconductor layer SEM2 and the third semiconductor layer SEM3 are etched to form the common electrode CE. The common electrode CE may be entirely formed on the plurality of light-emitting elements LE and the light-blocking partition wall PW1.

As described above, according to the display device according to the embodiments, the strain of the light-emitting element may be relieved by forming the porous semiconductor layer.

In addition, the wavelength of the emitted light may be shifted by adjusting the porosity of the porous semiconductor layer of the light-emitting element.

Figure 37:
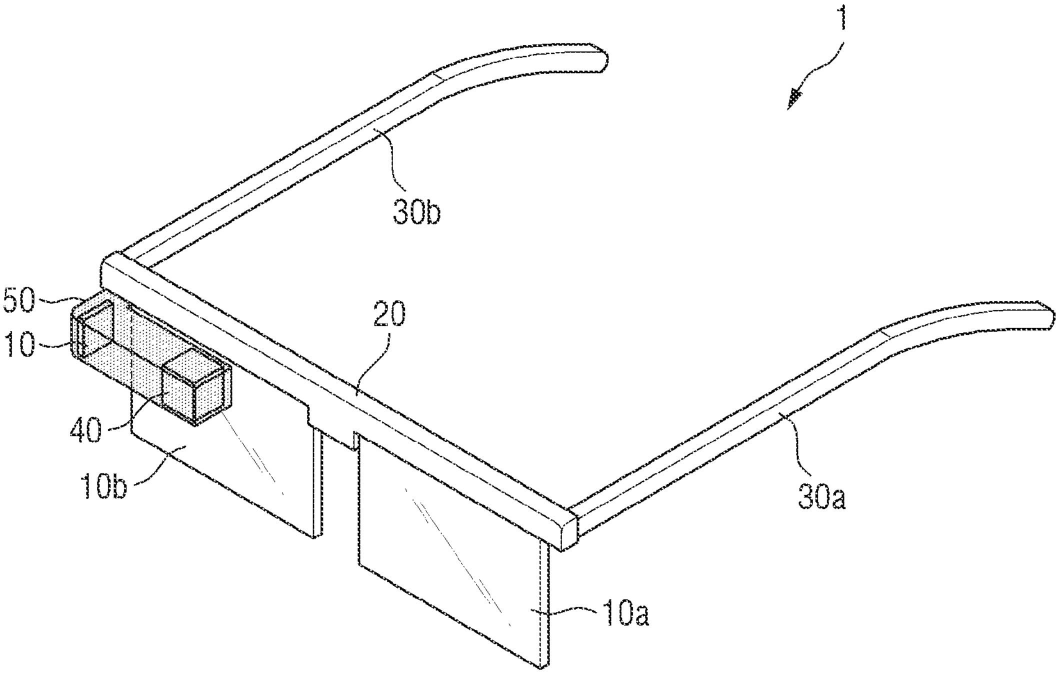
FIG. 37 is a diagram schematically showing a virtual reality device including a display device according to one or more embodiments.

FIG. 37 is a diagram illustrating a virtual reality device including a display device according to one or more embodiments. FIG. 37 illustrates a virtual reality device 1 in which the display device 10 according to one or more embodiments is used.

Referring to FIG. 37, the virtual reality device 1 according to one or more embodiments may be a device in a form of glasses. The virtual reality device 1 according to one or more embodiments may include a display device 10, a left-eye lens 10*a*, a right-eye lens 10*b*, a support frame 20, left and right legs 30*a* and 30*b*, a reflective member 40, and a display device housing 50.

FIG. 37 illustrates the virtual reality device 1 including the two legs 30*a* and 30*b*. However, the disclosure is not limited thereto. The virtual reality device 1 according to one or more embodiments may be used in a head-mounted display including a head-mounted band that may be mounted on a head, instead of including the legs 30*a* and 30*b*. For example, the virtual reality device 1 according to one or more embodiments may not be limited to that which is shown in FIG. 37, and may be applied in various forms and in various electronic devices.

The display device housing 50 may receive the display device 10 and the reflective member 40. An image displayed on the display device 10 may be reflected from the reflective member 40 and provided to a user's right eye through the right-eye lens 10*b*. Thus, the user may view a virtual reality image displayed on the display device 10 via the right eye.

FIG. 37 illustrates that the display device housing 50 is located at a right end of the support frame 20. However, one or more embodiments of the disclosure is not limited thereto. For example, the display device housing 50 may be located at a left end of the support frame 20. In this case, the image displayed on the display device may be reflected from the reflective member 40 and provided to the user's left eye via the left-eye lens 10*a*. Thus, the user may view the virtual reality image displayed on the display device 10 via the left eye. In one or more other embodiments, the display device housing 50 may be located at each of the left end and the right end of the support frame 20. In this case, the user may view the virtual reality image displayed on the display device 10 via both the left eye and the right eye.

Figure 38:
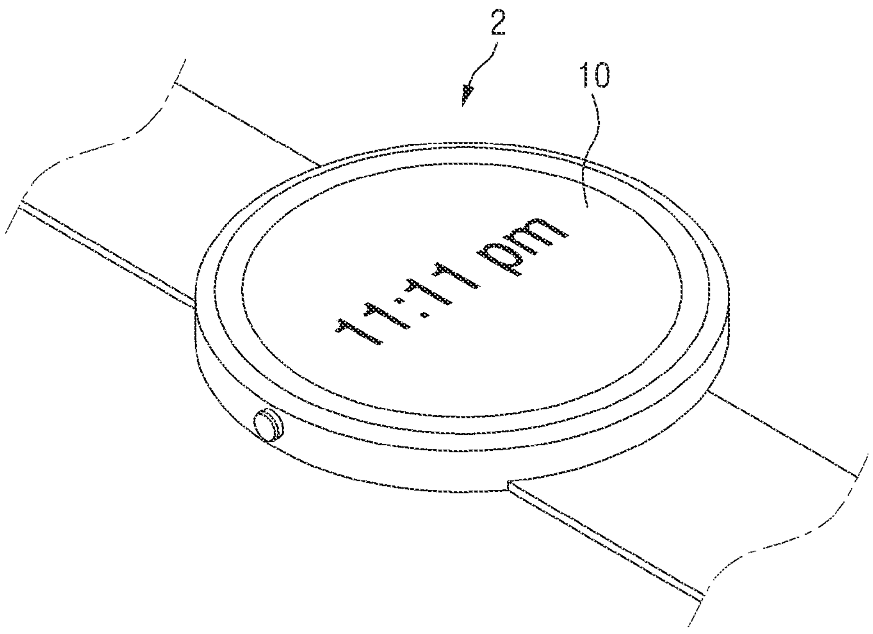
FIG. 38 is a diagram schematically showing a smart device including a display device according to one or more embodiments.

FIG. 38 is a diagram illustrating a smart device including a display device according to one or more embodiments.

Referring to FIG. 38, a display device 10 according to one or more embodiments may be applied to a smart watch 2 as one of smart devices.

Figure 39:
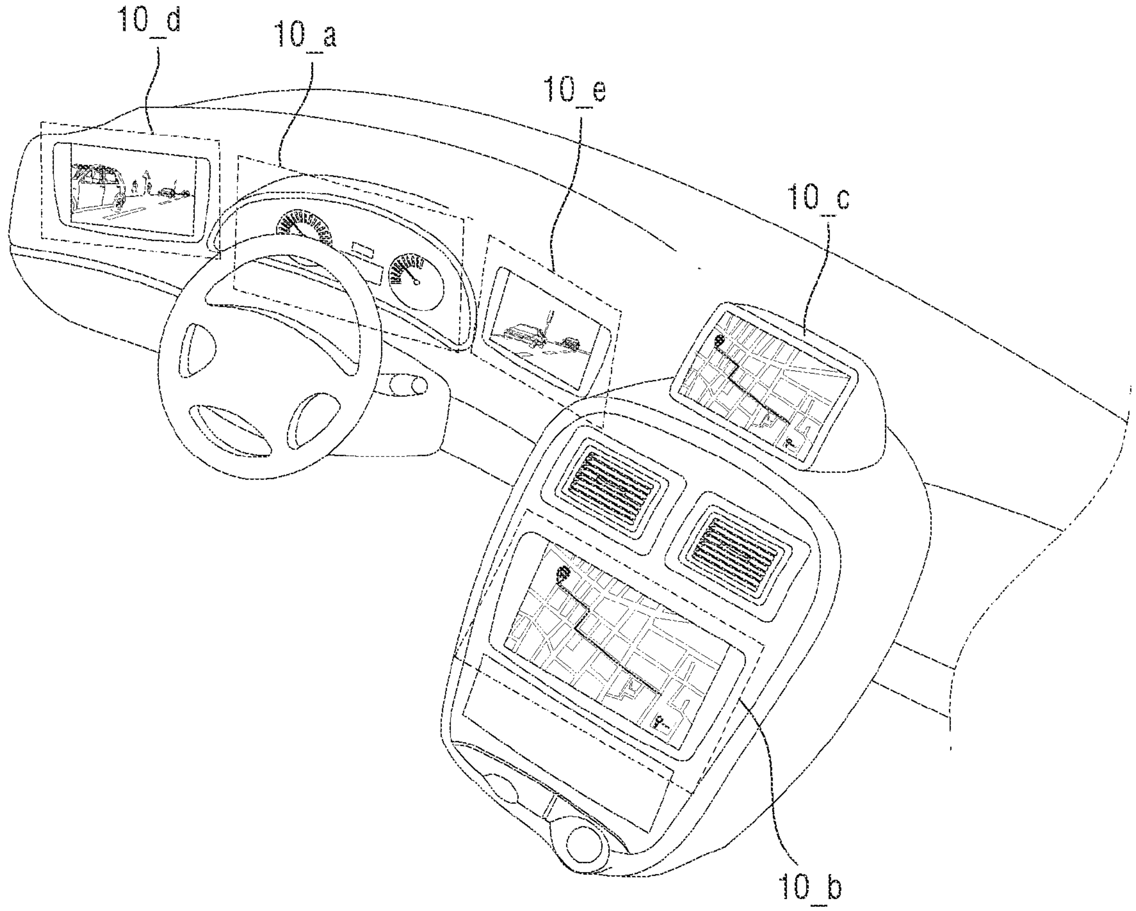
FIG. 39 is a diagram schematically showing a vehicle including a display device according to one or more embodiments.

FIG. 39 is a diagram illustrating a vehicle including a display device according to one or more embodiments. FIG. 39 illustrates a vehicle in which display devices according to one or more embodiments are used.

Referring to FIG. 39, the display devices 10_*a*, 10_*b*, and 10_*c* according to one or more embodiments may be applied to the dashboard of the vehicle, applied to the center fascia of the vehicle, or applied to a CID (Center Information Display) located on the dashboard of the vehicle. Further, each of the display devices 10_*d* and 10_*e* according to one or more embodiments may be applied to each room mirror display that replaces each of side-view mirrors of the vehicle.

Figure 40:
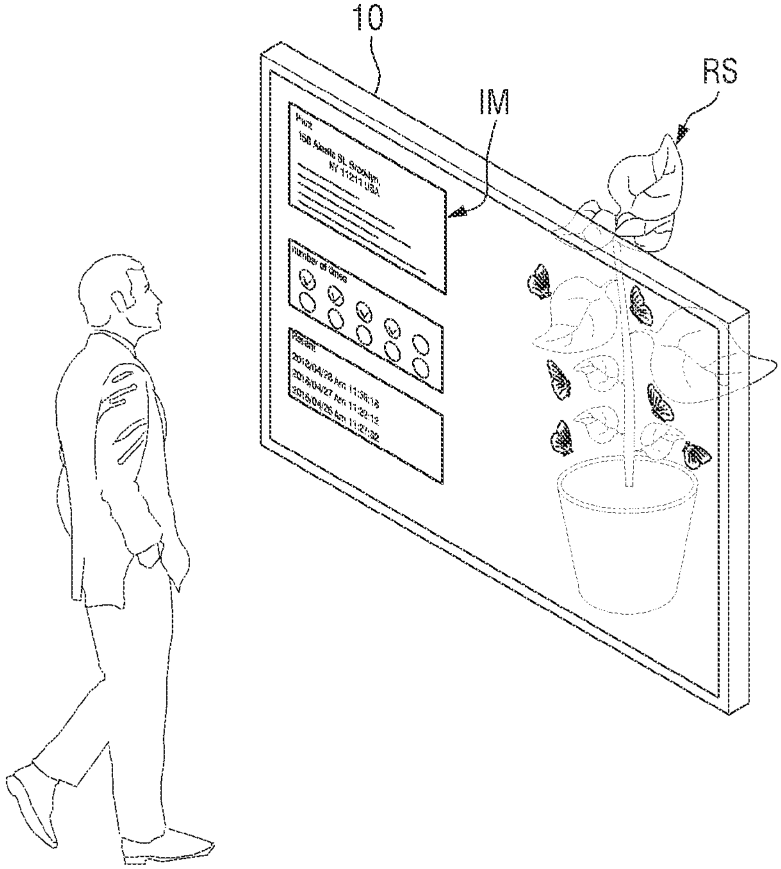
FIG. 40 is a diagram schematically showing a transparent display device including a display device according to one or more embodiments.

FIG. 40 is a diagram illustrating a transparent display device including a display device according to one or more embodiments.

Referring to FIG. 40, a display device according to one or more embodiments may be applied to a transparent display device. The transparent display device may transmit light therethrough while displaying an image IM thereon. Therefore, a user located in front of the transparent display device may not only view the image IM displayed on the display device 10, but also view an object RS or a background located in rear of the transparent display device. In case that the display device 10 is applied to the transparent display device, the semiconductor circuit board 110 of the display device 10 shown in FIG. 7 may include a light-transmitting portion that may transmit light therethrough or may be made of a material that may transmit light therethrough.

In concluding the detailed description, those skilled in the art will appreciate that many variations and modifications can be made to the embodiments without substantially departing from the aspects of the disclosure. Therefore, the disclosed embodiments of the disclosure are used in a generic and descriptive sense only and not for purposes of limitation.

What is claimed is:

1. A display device comprising:

a substrate comprising a pixel circuit unit;

a partition wall comprising a distributed Bragg reflector (DBR) structure partitioning a light-emitting area and a non-light-emitting area; and light-emitting elements above the substrate and corresponding to the light-emitting area, at least one of the light-emitting elements comprising a first semiconductor layer, an active layer, and a porous semiconductor layer.

2. The display device of claim 1, wherein the DBR structure comprises an undoped GaN layer (PW-U) and a porous GaN layer (PW-NP) that are alternately stacked.

3. The display device of claim 1, wherein the light-emitting elements comprise a first light-emitting element for emitting a first light, a second light-emitting element for emitting a second light, and a third light-emitting element for emitting a third light, and wherein the first light, the second light, and the third light have different respective wavelengths.

4. The display device of claim 3, wherein the partition wall defines a first opening unit, a second opening unit, and a third opening unit having different respective diameters, and overlapping a first light-emitting area, a second light-emitting area, and a third light-emitting area, respectively.

5. The display device of claim 4, wherein the first light-emitting element, the second light-emitting element, and the third light-emitting element respectively correspond to the first light-emitting area, the second light-emitting area, and the third light-emitting area, and wherein the porous semiconductor layer has a different porosity according to a respective wavelength of the light-emitting elements.

6. The display device of claim 5, wherein the first opening unit is wider than the second opening unit, and wherein a porosity of the porous semiconductor layer of the first light-emitting element is greater than that of the porous semiconductor layer of the second light-emitting element.

7. The display device of claim 3, wherein a wavelength of the first light is longer than that of the second light, and wherein a porosity of the porous semiconductor layer of the first light-emitting element is greater than that of the porous semiconductor layer of the second light-emitting element.

8. The display device of claim 5, wherein an indium content of the active layer of the first light-emitting element is higher than that of the active layer of the second light-emitting element, and wherein a porosity of the porous semiconductor layer of the first light-emitting element is greater than that of the porous semiconductor layer of the second light-emitting element.

9. The display device of claim 3, wherein the first light comprises a red light, the second light comprises a green light, and the third light comprises a blue light.

10. The display device of claim 1, further comprising a common electrode above the porous semiconductor layer, wherein the first semiconductor layer, the active layer, and the porous semiconductor layer are sequentially stacked in a direction away from the substrate.

11. The display device of claim 2, wherein the partition wall comprises:

a DBR structure layer comprising the DBR structure stacked in an extending direction of the light-emitting elements; and an insulating material layer in the non-light-emitting area excluding the DBR structure layer.

12. The display device of claim 1, wherein the substrate is above the pixel circuit unit, and further comprises pixel electrodes respectively connected to the pixel circuit unit.

13. The display device of claim 12, further comprising connection electrodes respectively between, and respectively connecting, the pixel electrodes and the light-emitting elements.

14. A display device comprising:

a substrate comprising a pixel circuit unit;

a light-blocking partition wall dividing a light-emitting area and a non-light-emitting area; and a first light-emitting element, a second light-emitting element, and a third light-emitting element above the substrate, at least one of the first, second, or third light-emitting elements comprising a first semiconductor layer, an active layer, and a porous semiconductor layer, wherein the first light-emitting element is configured to emit a first light, the second light-emitting element is configured to emit a second light, and the third light-emitting element is configured to emit a third light, and wherein the porous semiconductor layer has different respective porosities in the first light-emitting element, the second light-emitting element, and the third light-emitting element.

15. The display device of claim 14, further comprising a reflective layer between the light-blocking partition wall and the first light-emitting element, and surrounding a side surface of the first light-emitting element, wherein the light-blocking partition wall comprises an insulating material.

16. The display device of claim 15, wherein the reflective layer comprises a metal material having reflectivity.

17. The display device of claim 14, wherein the light-blocking partition wall defines a first opening unit, a second opening unit, and a third opening unit having different respective diameters, and respectively overlapping a first emitting area, a second emitting area, and a third emitting area.

18. The display device of claim 14, further comprising a common electrode above the porous semiconductor layer, wherein the first semiconductor layer, the active layer, and the porous semiconductor layer are sequentially stacked in a direction away from the substrate.

* * * * *